United States Patent
Itasaka et al.

(10) Patent No.: US 6,563,400 B2
(45) Date of Patent: May 13, 2003

(54) PIEZOELECTRIC RESONATOR UTILIZING BENDING VIBRATIONS AND LADDER-TYPE FILTER INCLUDING THE SAME

(75) Inventors: Yasuhiro Itasaka, Toyama (JP); Hirohide Yoshino, Toyama-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/962,176

(22) Filed: Sep. 25, 2001

(65) Prior Publication Data

US 2002/0075099 A1 Jun. 20, 2002

(30) Foreign Application Priority Data

Oct. 30, 2000 (JP) ........................................ 2000-329974

(51) Int. Cl.[7] .............................. H03H 9/54; H03H 9/58; H03H 9/17; H03H 9/205
(52) U.S. Cl. ....................... 333/187; 333/189; 310/321; 310/330; 310/357; 310/359
(58) Field of Search .................................. 333/186–192, 333/197, 199; 310/321, 323, 322, 330, 357, 359, 332

(56) References Cited

U.S. PATENT DOCUMENTS

| | | | | |
|---|---|---|---|---|
| 1,860,529 A | * | 5/1932 | Cady | 310/321 |
| 3,433,982 A | * | 3/1969 | Kaname et al. | 310/357 |
| 3,614,483 A | * | 10/1971 | Berlincourt | 310/321 |
| 4,666,315 A | * | 5/1987 | Scranton | 384/1 |
| 5,912,601 A | * | 6/1999 | Unami et al. | 333/187 |
| 6,150,902 A | * | 11/2000 | Unami | 333/189 |
| 6,420,945 B1 | * | 7/2002 | Yamamoto et al. | 333/189 |

FOREIGN PATENT DOCUMENTS

| | | | |
|---|---|---|---|
| EP | 0 829 957 A2 | * | 3/1998 |
| JP | 10-93379 | * | 4/1998 |
| JP | 2001-36376 | * | 2/2001 |
| JP | 2001-119262 | | 4/2001 |

* cited by examiner

Primary Examiner—Barbara Summons
(74) Attorney, Agent, or Firm—Keating & Bennett, LLP

(57) ABSTRACT

In a piezoelectric resonator utilizing bending vibrations, three or more electrode layers and two or more piezoelectric layers are alternately laminated, at least two layers of the piezoelectric layers are polarized in the thickness direction, first and second end surface electrodes are provided in the end surfaces of the laminated piezoelectric layers, and the electrode layers are connected to each other by using the first and second end surface electrodes such that, in at least one piezoelectric layer, an electric field is generated in the same direction as the polarization direction of the piezoelectric layer, and such that, in at least one of the other piezoelectric layers, an electric field is generated in a direction that is opposite to the polarization direction of the piezoelectric layer.

25 Claims, 25 Drawing Sheets

DISPLACEMENT ALONG A LINE CONNECTING THE MIDDLE OF SIDES

DISPLACMENT ALONG A DIAGONAL LINE

PIEZOELECTRIC RESONATOR UTILIZING BENDING VIBRATIONS AND LADDER-TYPE FILTER INCLUDING THE SAME

BACKGROUND OF THE INVENTION

1. Field of the Invention

The present invention relates to a piezoelectric resonator bending vibrations and a ladder-type filter including such a piezoelectric resonator.

2. Description of the Related Art

As piezoelectric resonators for use in a kHz band or for use in a frequency band of 100 kHz to 1 MHz in particular, piezoelectric resonators utilizing spreading vibrations are well known. In piezoelectric resonators utilizing spreading vibrations, the product of the length Ls of a side and the resonance frequency fr is generally constant, and it is defined by:

$$As = Ls \times fr$$

Here, As is a constant (frequency-related constant) and As≅2100 kHz·mm. For example, in order to obtain resonators having a resonance frequency of fr=455 kHz as in AM radios, the length Ls of the side becomes 4.62 mm.

In recent years, the miniaturization of equipment is more frequently required, and smaller-sized and thinner electronic components are being demanded. Under such circumstances, it is difficult to use electronic components having a length of a side that is 5 mm as described above. Furthermore, in ladder-type filters, the attenuation value is determined by the capacitance ratio between the parallel resonator and the series resonator. That is, in order to obtain a higher attenuation value, the capacitance between terminals of the parallel resonator may be increased and the capacitance between terminals of the series resonator may be decreased. However, when the capacitance between terminals of the parallel resonator is increased, it is inevitable to decrease the thickness of its piezoelectric substrate, and accordingly the mechanical strength is deteriorated and the range of the thickness is therefore very limited.

In consideration of such circumstances, the present inventor has proposed a piezoelectric resonator in which four or more electrode layers and three or more piezoelectric layers are alternately laminated, at least two of the piezoelectric layers are polarized in the thickness direction, and the above-described electrode layers are connected to each other such that, in a portion of the piezoelectric layers, an electric field is generated in the same direction as the polarization direction of the piezoelectric layers and that, in a portion of the other piezoelectric layers, an electric field is generated in a direction that is opposite to the polarization direction of the piezoelectric layers (Japanese Patent Application No. 11-294491).

In this piezoelectric resonator, since the piezoelectric layer in which the polarization direction and the direction of electric field are the same contracts in the planar direction and the piezoelectric layer in which the polarization direction and the direction of electric field are opposite to each other expands, bending vibration is generated as an entire piezoelectric resonator. In such a piezoelectric resonator utilizing bending vibrations, the dimensions thereof can be more reduced, compared with a piezoelectric resonator utilizing spreading vibrations, when both have the same resonance frequency. Moreover, since four or more electrode layers are provided, capacitance can be individually generated between electrode layers, and the total capacitance between terminals can be increased. Moreover, the piezoelectric layers are laminated, and accordingly even if each piezoelectric layer is thin, there is an advantage that a sufficient mechanical strength can be achieved.

However, in the piezoelectric resonator having the above-described construction, since an input electrode and an output electrode are separately disposed on both top and bottom main surfaces, when the piezoelectric resonator is mounted on a board, or substrate, after the electrode on one main surface has been connected to an electrode of the board, the electrode on the other main surface must be connected to another electrode on the board by wire bonding or by using terminals, etc., and accordingly it was difficult to establish connections. That is, the above-described piezoelectric resonator was not constructed in such a way that electrical characteristics can be taken out from either of the top and bottom main surfaces, and it was difficult to surface mount the piezoelectric resonator.

SUMMARY OF THE INVENTION

In order to overcome the problems described above, preferred embodiments of the present invention provide a very small-sized piezoelectric resonator in which electric characteristics can be taken out from either of the top and bottom main surfaces and which is appropriate for surface mounting, and to provide a ladder-type filter including such a piezoelectric resonator.

According to a first preferred embodiment of the present invention, a piezoelectric resonator utilizing bending vibrations, includes three or more electrode layers and two or more piezoelectric layers that are alternately laminated, first and second end surface electrodes provided on the end surfaces of the laminated piezoelectric layers, recessed portions for insulating the electrode layer, which is not connected to the first or second end surface electrodes, from the first or second end surface electrodes, the recessed portions provided in the periphery portion of the electrode layer not connected to the first or second end surface electrodes, insulation layers provided on the surface of the outermost electrode layers, and first and second external electrodes, which are connected to the first and second end surface electrodes respectively, provided on the outer surface of the insulation layers. At least a first and second of the piezoelectric layers are polarized in the thickness direction, and the first and second end surface electrodes and the electrode layers are connected such that, in at least the first of the piezoelectric layers, an electric field is generated in the same direction as the polarization direction in at least the first of the piezoelectric layers and that, in at least the second of the piezoelectric layers, an electric field is generated to be opposite to the polarization direction in the piezoelectric layer.

According to another preferred embodiment of the present invention, a piezoelectric resonator utilizing bending vibrations, includes three or more electrode layers and two or more piezoelectric layers alternately laminated, first and second end surface electrodes provided on the end surfaces of the laminated piezoelectric layers, a recessed portion, which is insulated from the first end surface electrode, provided in the periphery portion of one outermost layer of the electrode layers, and a first external electrode, which is connected to the first end surface electrode, provided in the recessed portion, and a recessed portion, which is insulated from the second end surface electrode, provided in the periphery portion of the other outermost electrode layer, and a second external electrode, which is connected to the second end surface electrode, provided in the recessed portion. Then, at least two of the piezoelectric layers are polarized in the thickness direction, and the first and second end surface electrodes and the electrode layers are connected such that, in at least a first one of the piezoelectric layers, an electric field is generated in the same direction as the polarization direction in the first of the piezoelectric layers and that, in at least a second one of the piezoelectric layers, an electric field is generated to be opposite to the polarization direction in the second of the piezoelectric layers.

Regarding the first preferred embodiment of the invention, since a piezoelectric layer in which the polarization direction and the direction of electric field are the same contracts in the planar direction and a piezoelectric layer in which the polarization direction and the direction of electric field are opposite to each other expands, bending vibration is generated as an entire piezoelectric resonator. In such a piezoelectric resonator utilizing bending vibrations, the dimensions thereof are greatly reduced, compared with a piezoelectric resonator utilizing spreading vibrations, when the resonance frequency is the same. For example, in order to obtain a resonator having a resonance frequency of fr=455 Hz, the resonator utilizing spreading vibrations has a side with a length of about 4.62 mm, but, in a resonator utilizing bending vibrations, the length of a side can be made to be about 1.2 mm, when the thickness of the resonator is about 0.2 mm. Furthermore, the first and second end surface electrodes and the electrode layers are connected, the insulation layers are provided on the surface of the outermost electrode layers, and the first and second external electrodes, which are connected to the first and second end surface electrodes, are provided on the outer surface of the insulation layers, and accordingly electrical characteristics can be taken out from either of the main surfaces of the piezoelectric resonator. That is, the piezoelectric resonator can be easily constructed as a surface mounting type component.

When the electrode layers are connected to each other by using the end surface electrodes, it is required to alternately connect the electrode layers to one end surface electrode and make the electrode layers alternately insulated from the end surface electrode. In order to make the electrode layers insulated from the end surface electrodes, insulators may be provided between the end surface electrodes and the electrode layers, but, as a result, this forces the insulators to be provided in the very narrow spaces, the manufacturing process becomes complicated, and the cost increases. Then, by forming the recessed portions in advance when the electrode layers are patterned on the piezoelectric layers, the electrode layers can be easily insulated from the end surface electrodes, and the manufacturing process can be simplified.

According to various preferred embodiments of the present invention, it is desirable that the piezoelectric layers and the insulation layers have a substantially square-form, that the first and second end surface electrodes are disposed substantially in the middle of the four sides of the piezoelectric layers, and that the first and second external electrodes are disposed substantially in the middle of the insulation layers. In the case of a substantially rectangular piezoelectric resonator utilizing bending vibrations, longer side and shorter side vibrations exist, but when the shape becomes close to a substantially square configuration, the frequencies of the shorter sides and longer sides approach each other, and when the shape finally comes to be substantially square, both frequencies coincide with each other to produce a very strong vibration. In the bending vibration, the nodal points are located in the vicinity of the circumference inscribed in the four sides. Accordingly, when the end surface electrodes and the external electrodes are disposed in the vicinity of the contacts between the nodal points and the four sides, that is, substantially in the middle of the four sides and the external electrodes are mounted on a board or other substrate, the bending vibration is not damped when mounted and excellent characteristics are achieved. In accordance with various preferred embodiments of the present invention, by forming the external electrodes in the vicinity of the nodal points of bending vibrations, excellent characteristics are achieved.

According to preferred embodiments of the present invention, the piezoelectric layers may be substantially square-shaped, and the first and second end surface electrodes may be disposed at the corner portions of the piezoelectric layers. When the end surface electrodes are provided at the corner portions, the recessed portions of the outside and inner electrode layers can be provided at the corner portions. In the piezoelectric resonator utilizing bending vibrations, the electrical characteristic ($\Delta f$) is affected by the shape of the electrodes, and then least affected at the corner portions. Therefore, by forming the end surface electrodes at the corner portions, a piezoelectric resonator in which the electrical characteristic is not affected can be obtained.

According to preferred embodiments of the present invention, the recessed portions of the electrode layers may be formed to be belt-shaped along the periphery portion of the electrode layers. In the case in which the belt-shaped recessed portions are provided, when the electrode layers are formed, it is enough to align the corner portions and the displacement in length and width directions can be neglected. Therefore, the electrode layers can be easily positioned when the piezoelectric layers are laminated.

According to various preferred embodiments of the present invention, the piezoelectric layers may be formed to be substantially square-shaped, and the first and second end surface electrodes may be provided on the opposing sides of the piezoelectric layers. In this case, the external electrodes for input and output purposes are provided on the opposing sides, and it is enough to provide electrode pads at two locations when mounted on a circuit board or other substrate. In the case in which the first and second end surface electrodes are provided on the adjacent sides of the piezoelectric layers, it means that the external electrodes for input and output purposes are provided on the adjacent sides, and then it is required to provide electrode pads at four locations on a circuit board.

According to preferred embodiments of the present invention, the outermost electrode layer is commonly used as one external electrode and the other external electrode is disposed in its recessed portion, and then without providing any insulation layers, the same operation as in the first preferred embodiment of the present invention can be realized, that is, electrical characteristics can be taken out from either of the main surfaces.

According to various preferred embodiments of the present invention, it is desirable that concave grooves, which are continuous in the thickness direction, are provided in the end surfaces of the laminated piezoelectric layers, and that the end surface electrodes are constructed by using the electrodes disposed on the inner surface of the concave grooves. The concave grooves and their inner surface electrodes can be easily arranged such that through-holes passing through the piezoelectric layers laminated in the state of a mother board are provided, that an electrode film is formed on the inner surfaces thereof, and that the laminated piezoelectric layers are cut at the location of the through-holes.

Furthermore, since the inner surface electrodes can be formed at the same time when electrode layers are formed on the surface of piezoelectric layers, a particular process for forming the end surface electrodes is not necessary, and accordingly the manufacturing process is greatly simplified.

According to preferred embodiments of the present invention, a very small-sized ladder-type filter having excellent filter characteristics can be obtained by providing a piezoelectric resonator utilizing bending vibrations to define a series resonator and a parallel resonator in the ladder-type filter. In the case of ladder-type filters, a plurality of series resonators and a plurality of parallel resonators are often used in order to obtain a high attenuation value. When a very small-sized piezoelectric resonator according to preferred embodiments of the present invention is used as a series resonator and a parallel resonator, a very small-sized ladder-type filter as a whole can be realized.

According to various preferred embodiments of the present invention, it is desirable to construct the parallel resonator by using a piezoelectric resonator having more piezoelectric layers than a piezoelectric resonator in the series resonator. The attenuation value in a ladder-type filter is determined by the capacitance ratio between the parallel resonator and the series resonator. In the piezoelectric resonator according to preferred embodiments of the present invention, the capacitance between terminals can be arbitrarily increased by increasing the number of piezoelectric layers. Then, when the parallel resonator is constructed by using a piezoelectric resonator having more piezoelectric layers, the capacitance ratio between the parallel resonator and the series resonator can be unrestrictedly increased, and accordingly the attenuation value of a filter can be increased without restraint.

According to preferred embodiments of the present invention, it is desirable that the series resonator and the parallel resonator utilizing bending vibrations are mounted in one plane on a board on which input electrodes, output electrodes, grounding electrodes, and connection electrodes are patterned, and that a cap is fixed on the board so as to cover the series resonator and the parallel resonator. Since electrical characteristics can be taken out from either of the top and bottom main surfaces, the piezoelectric resonator according to preferred embodiments of the present invention can be arranged in one plane on a board, and electrical connections to the board can be simplified.

Other features, elements, characteristics and advantages of the present invention will become more apparent from the following detailed description of the preferred embodiments with reference to the attached drawings.

DETAILED DESCRIPTION OF PREFERRED EMBODIMENTS

Figure 1:
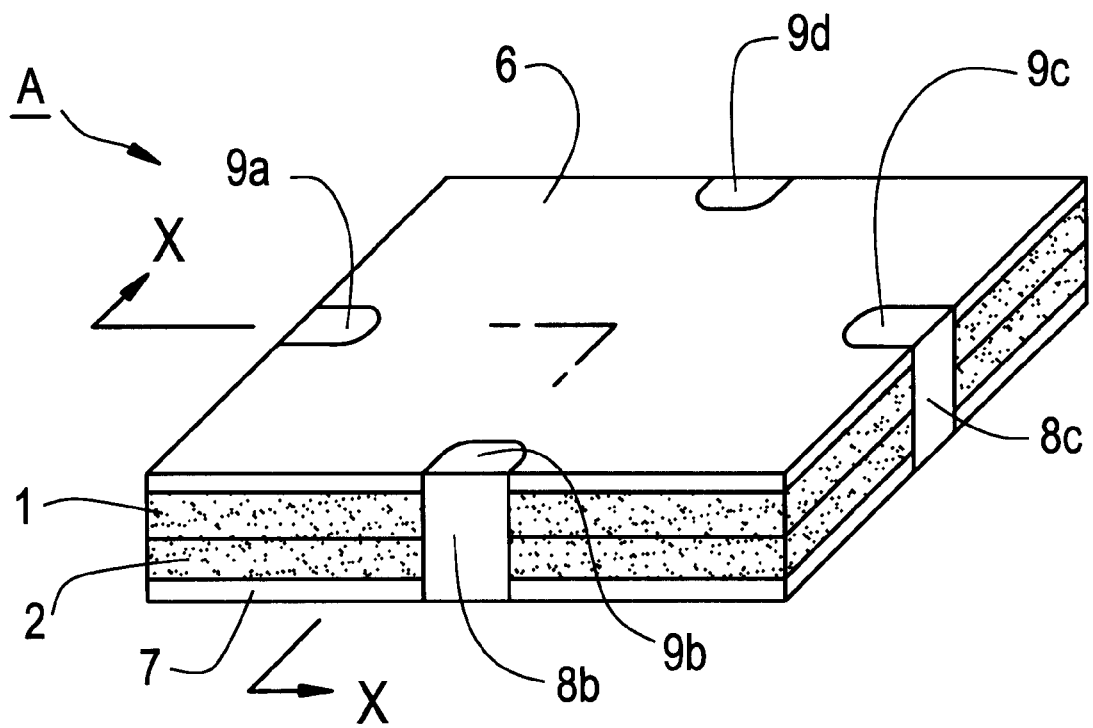
FIG. 1 is a perspective view of a first preferred embodiment of a piezoelectric resonator according to the present invention.
Figure 2:
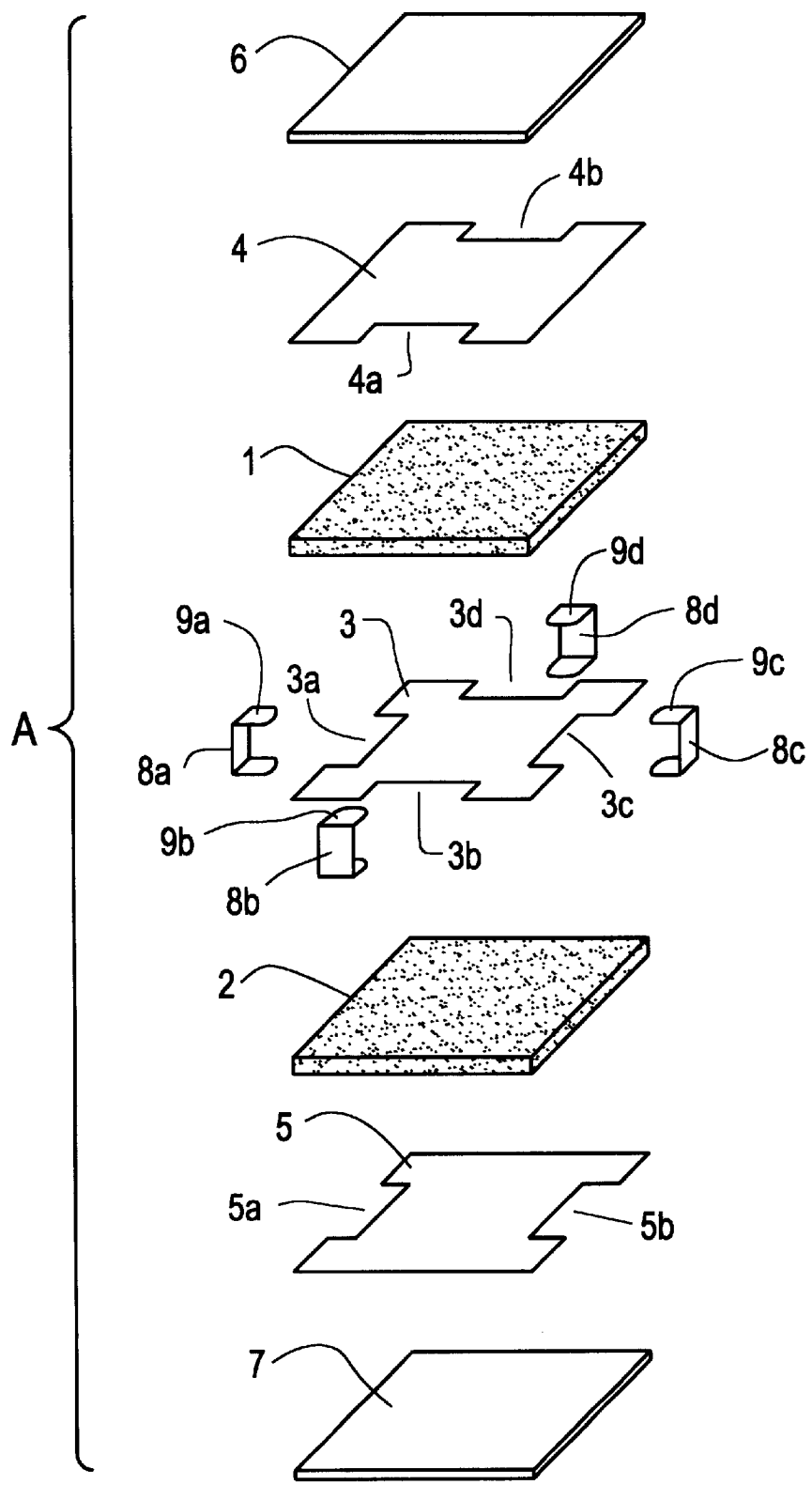
FIG. 2 is an exploded perspective view of the piezoelectric resonator shown in FIG. 1.
Figure 3:
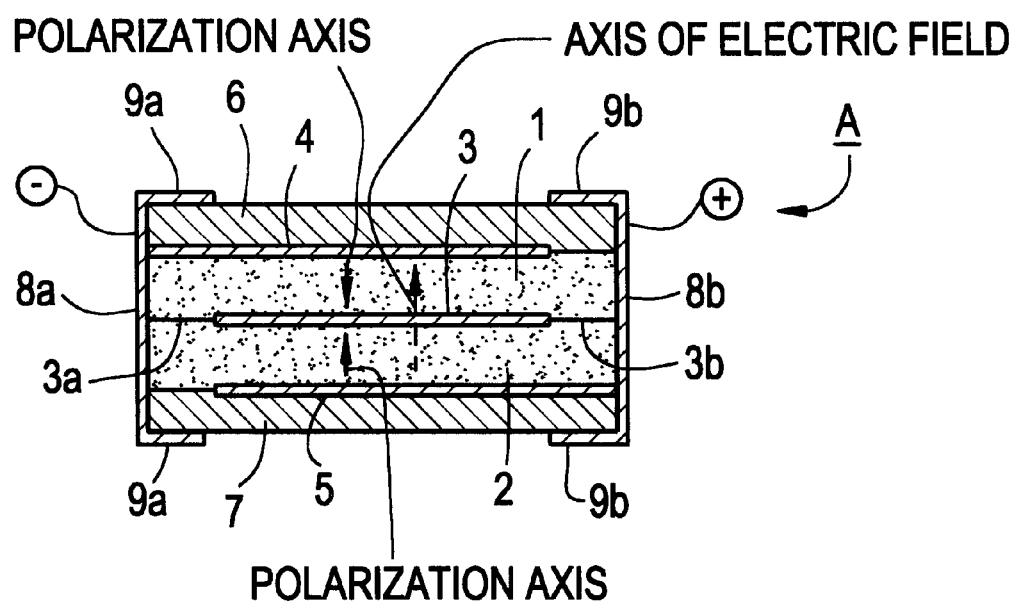
FIG. 3 is a sectional view taken on line X—X of FIG. 1.

FIGS. 1 to 3 show a first preferred embodiment of a piezoelectric resonator according to the present invention.

This piezoelectric resonator A is a ceramic resonator that is preferably used in a frequency band of about 100 kHZ to about 1 MHz. In the piezoelectric resonator A, two substantially square piezoelectric layers 1 and 2 are laminated with an internal electrode 3 sandwiched therebetween, surface electrodes 4 and 5 are disposed on the top and bottom main surfaces of the laminated piezoelectric layers 1 and 2, and, furthermore, the outermost substantially square insulation layers 6 and 7 are laminated. The insulation layers 6 and 7 may be formed by using, for example, a material having no piezoelectric characteristics such as alumina ceramics, or other suitable material, and a material having piezoelectric characteristics, but not being polarized such as piezoelectric ceramics, resin material, or other suitable material.

The two piezoelectric layers 1 and 2 are polarized in opposite directions relative to each other as shown by solid line arrows in FIG. 3. Moreover, the polarization direction is not limited to the inward direction shown in FIG. 3, but may be outward. Four end surface electrodes 8a, 8b, 8c, and 8d are preferably disposed on the end surfaces of the laminated piezoelectric layers 1 and 2 and insulation layers 6 and 7, particularly in the middle portion of each of the four sides. The opposing end surface electrodes 8a and 8c are connected to the surface electrode 4 on the top surface and insulated from the internal electrode 3 and the surface electrode 5 on the bottom surface. Furthermore, the opposing end surface electrodes 8b and 8d are connected to the bottom surface electrode 5 and insulated from the internal electrode 3 and the top surface electrode 4. Because of that, recessed portions 3a to 3d are formed in the middle of each of the four sides of the internal electrode 3, recessed portions 4a and 4b are formed in the middle of each of the two opposing sides of the top surface electrode 4, and recessed portions 5a and 5b are formed in the sides of the bottom surface electrode 5, which are different from the sides where the recessed portions 4a and 4b are formed. The internal electrode 3 is used mainly for polarization of the piezoelectric layers 1 and 2 and, when vibrated, functions as a floating electrode that is not connected to the end surface electrodes 8a, 8b, 8c, and 8d.

External electrodes 9a, 9b, 9c, and 9d extending to the surface of the insulation layers are disposed at both ends of the end surface electrodes 8a, 8b, 8c, and 8d. These external electrodes are positioned in the middle of each of the four sides of the insulation layers 6 and 7. The electrical characteristic of the above-described piezoelectric resonator A is taken out from the external electrodes 9a and 9b, or 9c and 9d. Since the external electrodes 9a to 9d are provided on both of the top and bottom main surfaces, the electrical characteristic can be taken out from either of the top and bottom main surfaces.

In the piezoelectric resonator A having the above-described construction, when a negative electric potential is applied to one external electrode 9a and a positive electric potential is applied to the other external electrode 9b, an electric field in the same direction is generated in the two piezoelectric layers 1 and 2 as shown by a broken line arrow in FIG. 3. On the other hand, since the polarization directions in the piezoelectric layers 1 and 2 are opposite to each other, the polarization and the direction of electric field are opposite to each other in one piezoelectric layer 1 and the polarization and the direction of electric field become the same in the other piezoelectric layer 2. The piezoelectric layer 2 in which the polarization and the direction of electric field are the same contracts in the planar direction and the piezoelectric layer 1 in which the polarization and the direction of electric field are opposite to each other expands, and accordingly, the entire piezoelectric resonator A bends so as to be protruded upward. When the direction of the electric field is reversed, the piezoelectric resonator A bends in the opposite direction. Therefore, when an AC electric field is applied between the external electrodes 9a and 9b, or 9c and 9d, bending vibration of the piezoelectric resonator A is generated at a fixed frequency.

The above-described piezoelectric resonator A can be simply manufactured such that, after piezoelectric layers 1 and 2 and insulation layers 6 and 7 in the state of a mother board have been laminated with electrodes 3, 4, and 5 sandwiched therebetween and the piezoelectric layers 1 and 2 have been polarized by applying a high voltage between the internal electrode 3 and the surface electrodes 4 and 5, the laminated mother boards are cut into substantially square forms and end surface electrodes 8a to 8d are formed on the end surfaces of each, and, furthermore, the productivity in mass production is high. In particular, the electrodes 3, 4, and 5 having the recessed portions 3a to 3d, 4a, 4b, 5a, and 5b are formed in the piezoelectric layers 1 and 2 in the state of a mother board in advance, and, after the piezoelectric layers 1 and 2 have been laminated, the end surface electrodes 8a to 8d are formed on the cut surfaces of the piezoelectric layers 1 and 2, and then the electrodes 4 and 5 can be selectively connected to the end surface electrodes 8a to 8d.

Figures 4A, 4B:
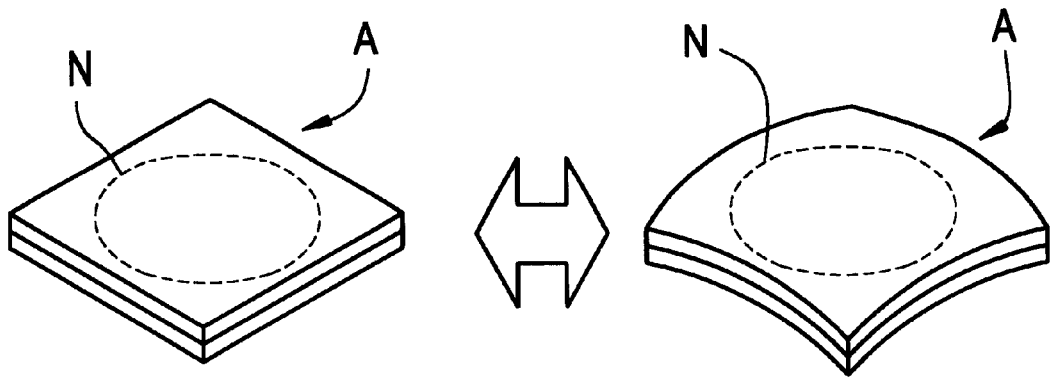
FIGS. 4A and 4B show the nodal points and the displacement of the piezoelectric resonator shown in FIG. 1.

When the piezoelectric resonator A having the above-described construction is mounted on a circuit board or other substrate, the external electrodes 9a, 9b, 9c, and 9d are soldered to the electrodes on the circuit board. The nodal points N of the piezoelectric resonator A exist on a circumference approximately inscribed to the four sides as shown by a broken line in (a) of FIG. 4. Therefore, when the external electrodes 9a, 9b, 9c, and 9d are disposed on these nodal points N, the damping of vibration is reduced in the mounted state and excellent characteristics are obtained. Portion (b) of FIG. 4 shows the state where the piezoelectric resonator A is bent so as to be protruded upward, and when the electric field is reversed, it is bent in the opposite way.

Figure 5A:
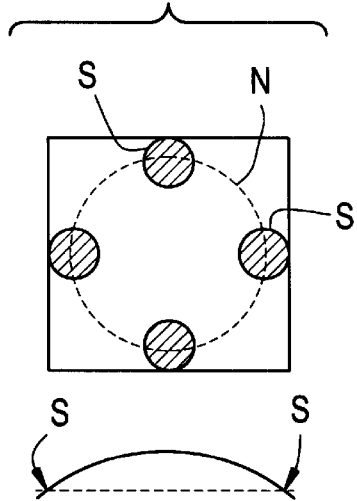
FIGS. 5A to 5C show the supporting methods of the piezoelectric resonator shown in FIG. 1.
Figure 5B:
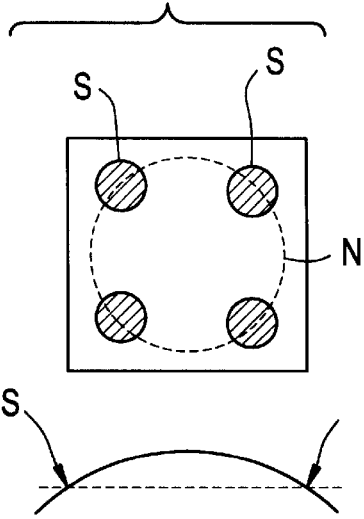
Figure 5C:
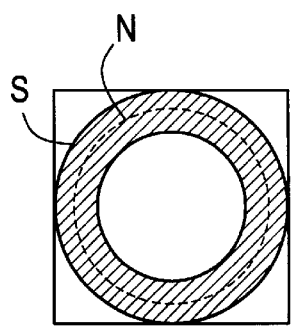

As described above, since the nodal points of the piezoelectric resonator A exist on the circumference approximately inscribed to the four sides, when the piezoelectric resonator A is mounted on a circuit board or other substrate, there are a method where the middle portions of the four sides are supported as shown in FIG. 5A, a method where the points on the diagonal lines are supported as shown in FIG. 5B, a method where the ring-shaped portion is supported as in FIG. 5C, etc. S represents a supporting portion. In this case, when compared with the method where the ring-shaped portion is supported as in FIG. 5C, the methods where the points are supported as in FIGS. 5A and 5B show that the damping of vibrations of an element is less. Furthermore, between the methods where the points are supported, the method where the middle portions of the sides are supported as in FIG. 5A shows less displacements around the nodal points N and less damping than the method where the points on the diagonal lines are supported as in 5B. Therefore, the method where the external electrodes 9a, 9b, 9c, and 9d are provided in the middle portions of the four sides as shown in FIG. 5A is the most effective in reduction of the damping of vibrations.

Figure 6:
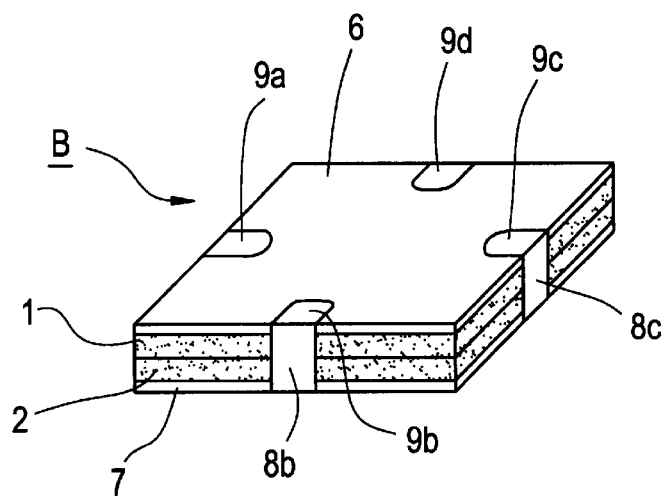
FIG. 6 is a perspective view of a second preferred embodiment of a piezoelectric resonator according to the present invention.
Figure 7:
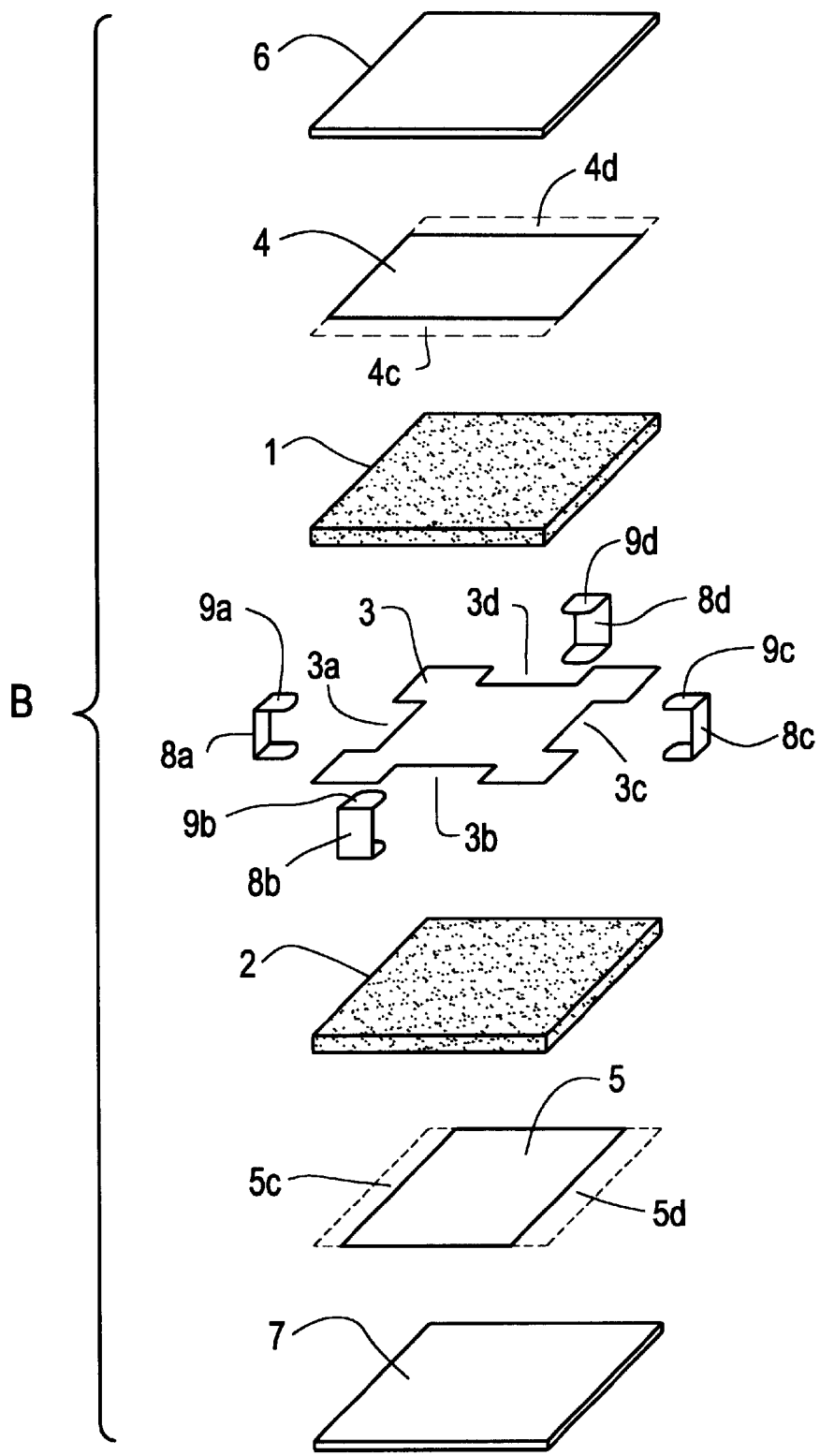
FIG. 7 is an exploded perspective view of the piezoelectric resonator shown in FIG. 6.

FIGS. 6 and 7 show a second preferred embodiment of a piezoelectric resonator according to the present invention. This piezoelectric resonator B has two piezoelectric layers similar to the piezoelectric resonator A, and the same reference numerals are used to indicate similar elements as in the piezoelectric resonator A and repetitious description is omitted. In the piezoelectric resonator B, recessed portions 4c and 4d of the surface electrode 4 on the top surface and the recessed portions 5c and 5d of the surface electrode 5 on the bottom surface preferably have a belt shape along the opposing edge portions of the electrodes 4 and 5, respectively. When the belt-shaped recessed portions 4c and 4d, and 5c and 5d are constructed in this way, since the displacement in the extension direction of the recessed portions can be neglected, it becomes easy to make the electrodes 4 and 5 registered when the piezoelectric layers 1 and 2 are laminated.

Figure 8:
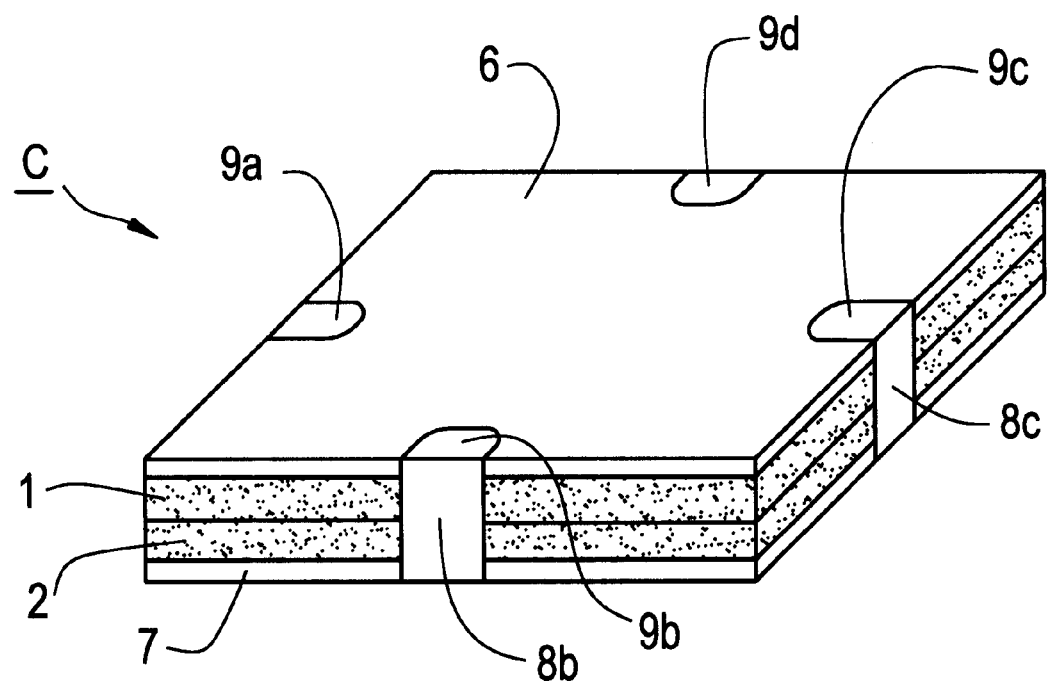
FIG. 8 is a perspective view of a third preferred embodiment of a piezoelectric resonator according to the present invention.
Figure 9:
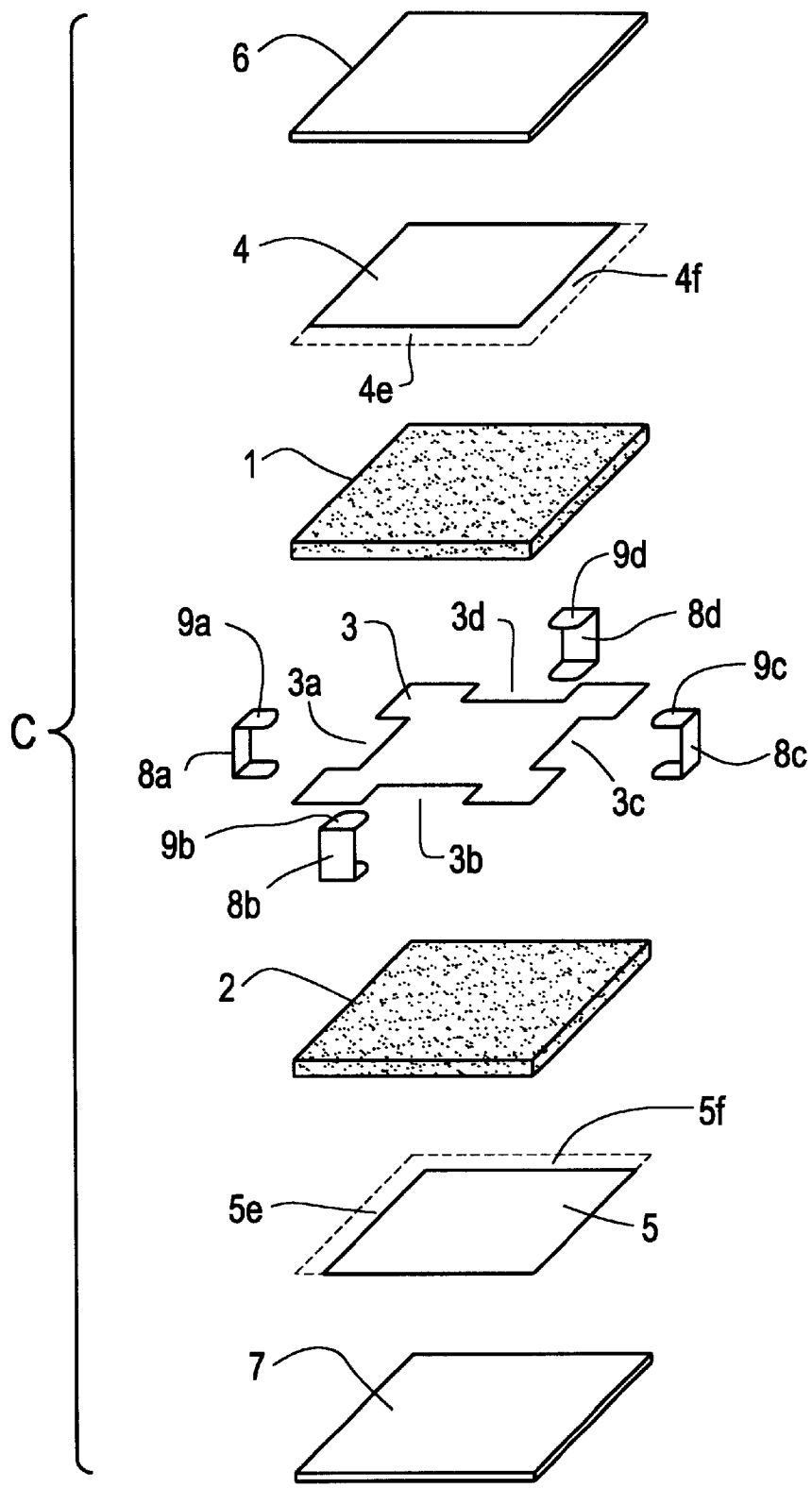
FIG. 9 is an exploded perspective view of the piezoelectric resonator shown in FIG. 8.

FIGS. 8 and 9 show a third preferred embodiment of a piezoelectric resonator according to the present invention. This piezoelectric resonator C has two piezoelectric layers similar to the piezoelectric resonator A, and the same reference numerals are used to indicate similar elements as in the piezoelectric resonator A and repetitious description is omitted. In the piezoelectric resonator C, recessed portions 4e and 4f of the surface electrode 4 on the top surface and the recessed portions 5e and 5f of the surface electrode 5 on the bottom surface preferably have a substantially L-shaped belt along the adjacent edge portions of the electrodes 4 and 5, respectively. The recessed portions 4e and 4f and the recessed portions 5e and 5f are arranged along the different edges from those of each other of the electrodes 4 and 5. In this case, the external electrodes 9a and 9d on the adjacent sides are connected to each other through the surface electrode 4 and the end surface electrodes 8a and 8d, and the external electrodes 9b and 9c are connected to each other through the surface electrode 5 and the end surface electrodes 8b and 8c. Because of that, when an AC electric field is applied between the external electrodes 9a and 9b, or 9d and 9c, bending vibration is generated in the piezoelectric resonator C.

Figure 10:
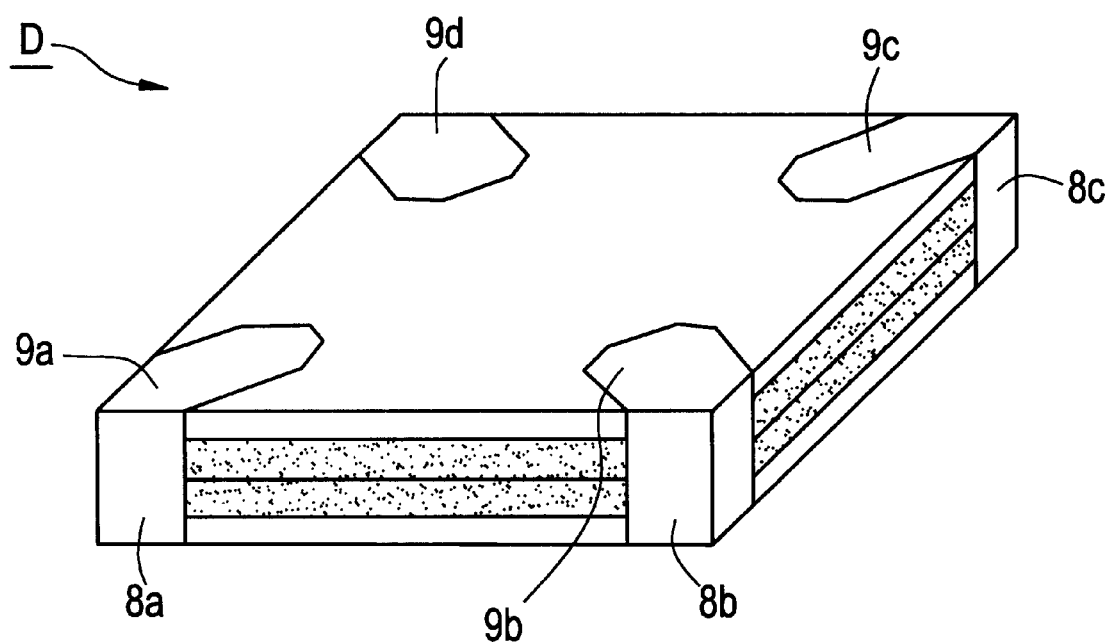
FIG. 10 is a perspective view of a fourth preferred embodiment of a piezoelectric resonator according to the present invention.
Figure 11:
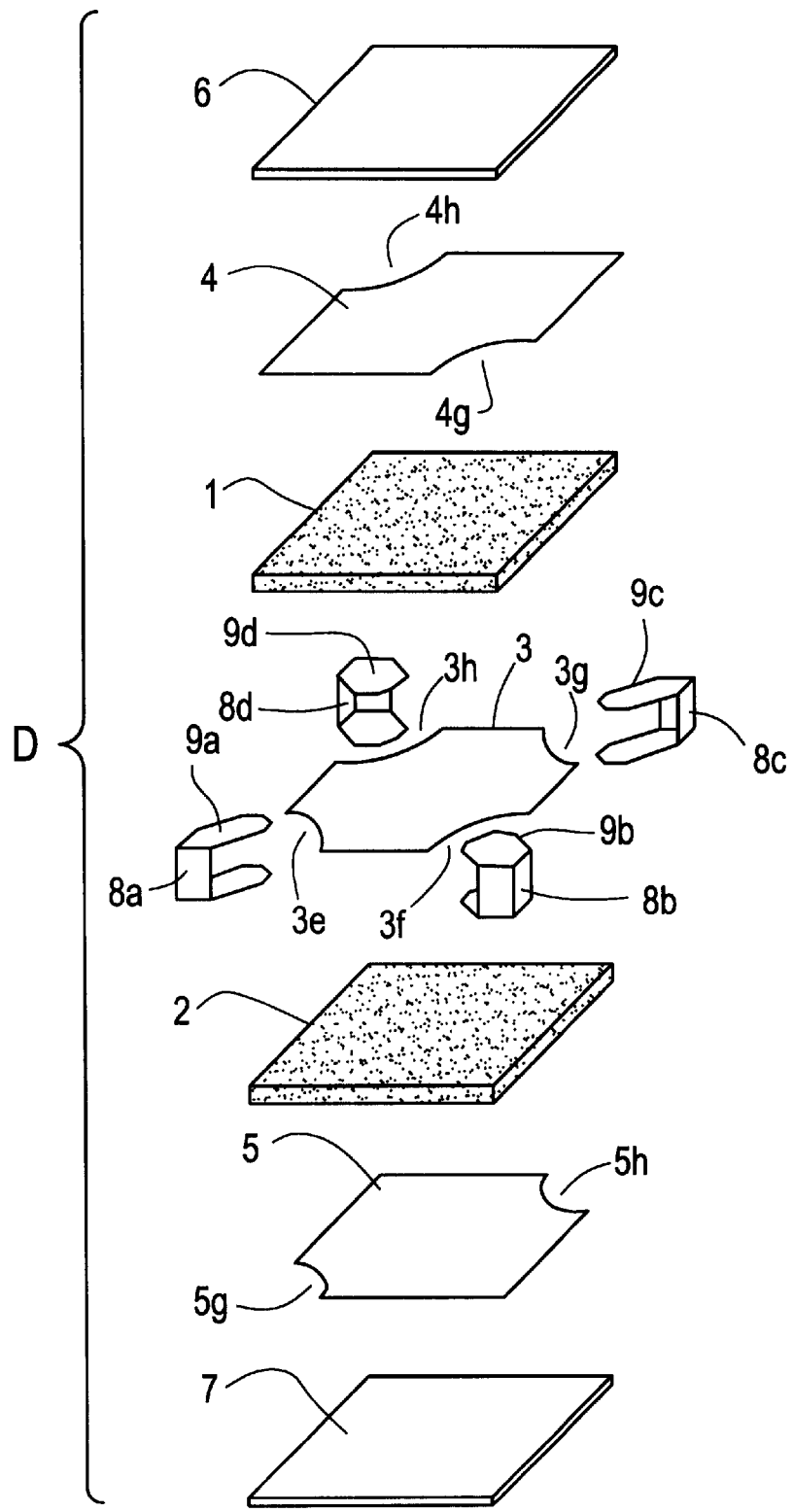
FIG. 11 is an exploded perspective view of the piezoelectric resonator shown in FIG. 10.

FIGS. 10 and 11 show a fourth preferred embodiment of a piezoelectric resonator according to the present invention. This piezoelectric resonator D has two piezoelectric layers similar to the piezoelectric resonator A, and the same reference numerals are used to indicate similar elements of the piezoelectric resonator A and repetitious description is omitted. In the piezoelectric resonator D, recessed portions 3e, 3f, 3g, and 3h are formed in the four corners of the internal electrode 3, two recessed portions 4g and 4h are formed in the opposing two corner portions of the top surface electrode 4, and two recessed portions 5g and 5h are formed in the opposing two corner portions of the bottom surface electrode 5. The recessed portions 4g and 4h and the recessed portions 5g and 5h are formed at different corner portions. In this case, the end surface electrodes 8a to 8d corresponding to the recessed portions are also arranged so as to extend over the two end surfaces of each corner of the piezoelectric layers 1 and 2 and the insulation layers 6 and 7. Then, the external electrodes 9a to 9d connected to the end surface electrodes 8a to 8d are diagonally extended from the four corner portions on the surface of the insulation layers 6 and 7 to the nodal points shown in FIG. 5. In this preferred embodiment, since the recessed portions 4g and 4h, and 5g and 5h are located at the locations (corner portions) that do not affect the bending vibrations, electrical characteristics are effectively improved (for example, Δf increases).

Figure 12:
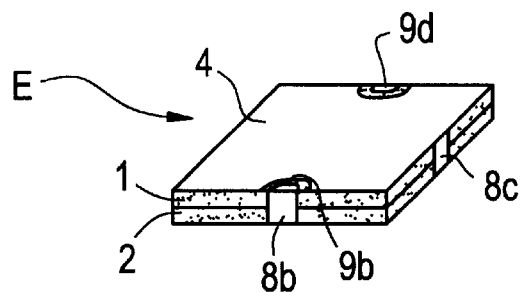
FIG. 12 is a perspective view of a fifth preferred embodiment of a piezoelectric resonator according to the present invention.
Figure 13:
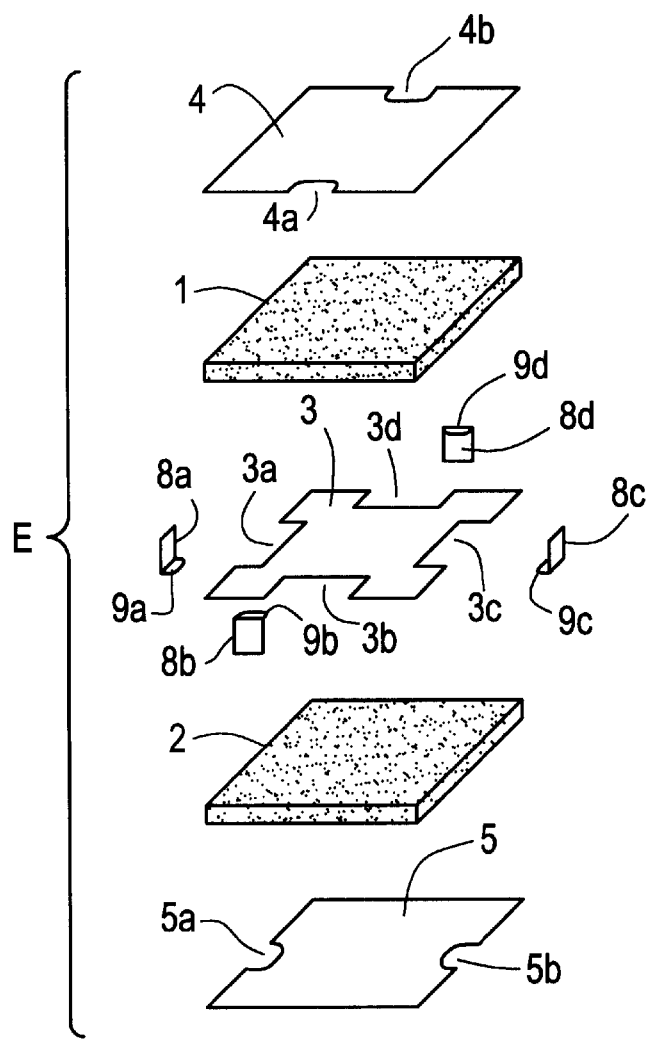
FIG. 13 is an exploded perspective view of the piezoelectric resonator shown in FIG. 12.
Figure 14:
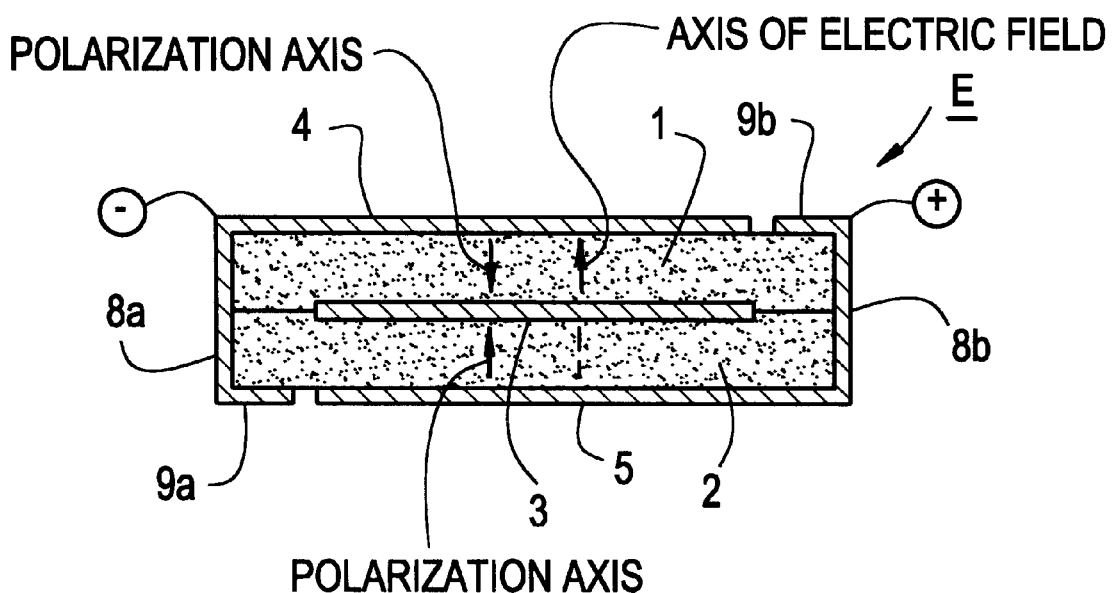
FIG. 14 is a sectional view, taken in the same way as in FIG. 3, of the piezoelectric resonator shown in FIG. 12.

FIGS. 12 to 14 show a fifth preferred embodiment of a piezoelectric resonator according to the present invention. This piezoelectric resonator E preferably has two piezoelectric layers in the same way as the piezoelectric resonator A according to the first preferred embodiment, but does not include the outermost insulation layers. In the piezoelectric resonator E, the two piezoelectric layers 1 and 2 are polarized opposite to each other as shown by solid line arrows in FIG. 14, in the same way as in the piezoelectric resonator A. Moreover, the polarization direction is not limited to the inward direction shown in FIG. 14, but it may be in the outward direction.

In this preferred embodiment, the external electrodes 9a and 9c are disposed only at the lower end portions of the opposing two end surface electrodes 8a and 8c, of the opposing two sides, out of the end surface electrodes 8a to 8d, and the external electrodes 9b and 9d are disposed only at the upper end portions of the other opposing two end surface electrodes of the other opposing sides. Then, the external electrodes 9a and 9c are provided at the location of the recessed portions 5a and 5b of the bottom surface electrode 5, and the external electrodes 9b and 9d are provided at the location of the recessed portions 4a and 4b of the top surface electrode 4. In the case of the above-described piezoelectric resonator E, the top and bottom surface electrodes 4 and 5 are also used as an external electrode. Therefore, the electrical characteristic of the piezoelectric resonator E is taken out between the external electrode 9b or 9d and the surface electrode 4 on the top surface, and between the external electrode 9a or 9c and the bottom electrode 5 on the bottom surface.

Figure 15:
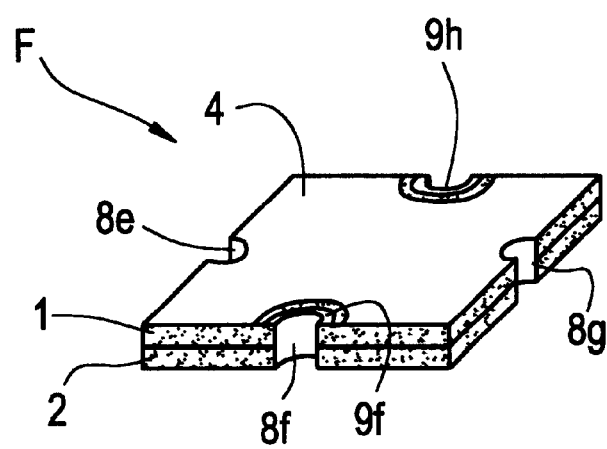
FIG. 15 is a perspective view of a sixth preferred embodiment of a piezoelectric resonator according to the present invention.
Figure 16:
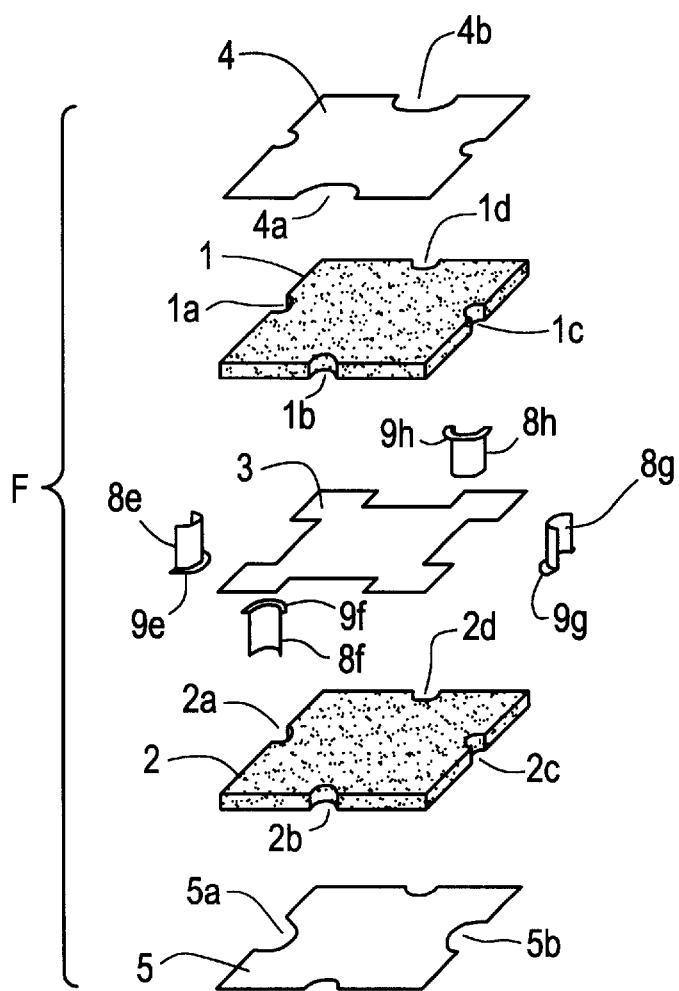
FIG. 16 is an exploded perspective view of the piezoelectric resonator shown in FIG. 15.

FIGS. 15 to 16 show a sixth preferred embodiment of a piezoelectric resonator according to the present invention. This piezoelectric resonator F has two piezoelectric layers similar to the piezoelectric resonator A, but does not include the outermost insulation layers. In the piezoelectric resonator F, concave grooves 1a to 1d and 2a to 2d are provided in the end surfaces of the laminated piezoelectric layers 1 and 2 in the thickness direction, and the end surface electrodes include electrodes 8e to 8h disposed on the inner surface of the concave grooves. The lower end portions of the opposing two inside surface electrodes 8e and 8g, out of the inside surface electrodes 8e to 8h, are connected to external electrodes 9e and 9g disposed in the recessed portions 5a and 5b of the bottom electrode 5, and the upper end portions of the other opposing two internal electrodes 8f and 8h are connected to the external electrodes 9f and 9h disposed in the recessed portions 4a and 4b of the top electrode 4. In the case of this preferred embodiment, the concave grooves 1a to 1d and 2a to 2d can be easily formed such that through-holes are formed in the laminated piezoelectric layers 1 and 2 in the state of a mother board and the through-holes are divided into two parts. Moreover, since the inside surface electrodes 8e to 8h are able to be formed at the same time when the top and bottom electrodes 4 and 5 are formed, there is an advantage that the manufacturing process is greatly simplified.

Figure 17:
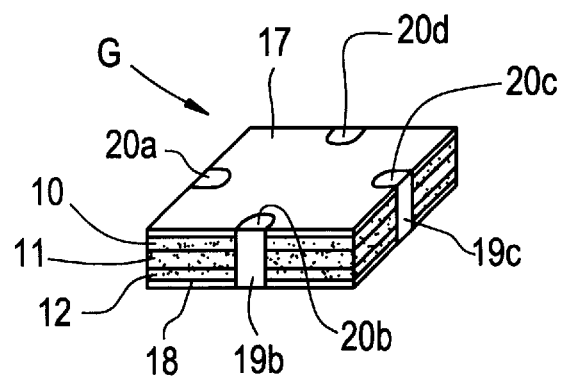
FIG. 17 is a perspective view of a seventh preferred embodiment of a piezoelectric resonator according to the present invention.
Figure 18:
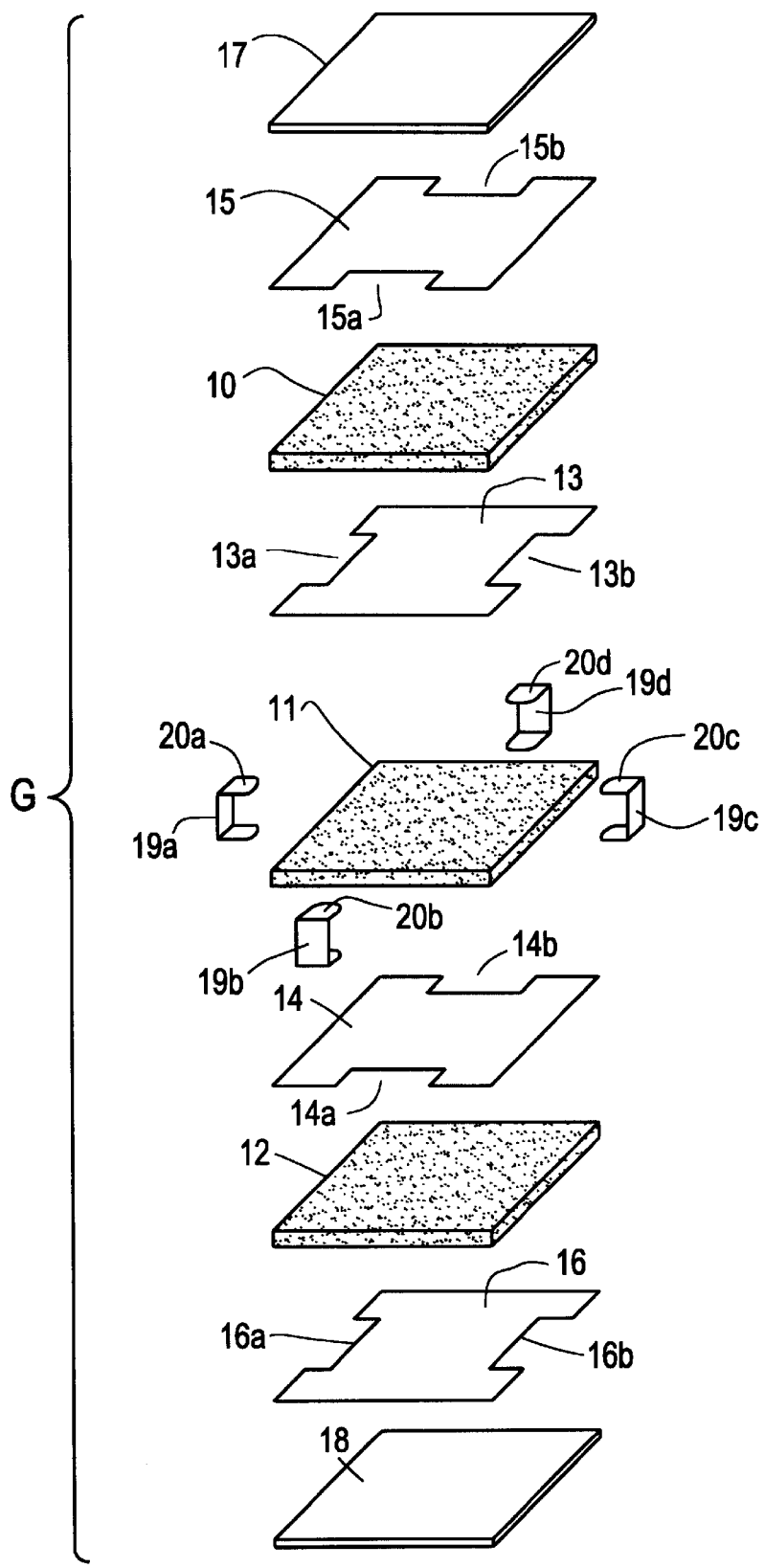
FIG. 18 is an exploded perspective view of the piezoelectric resonator shown in FIG. 17.
Figure 19:
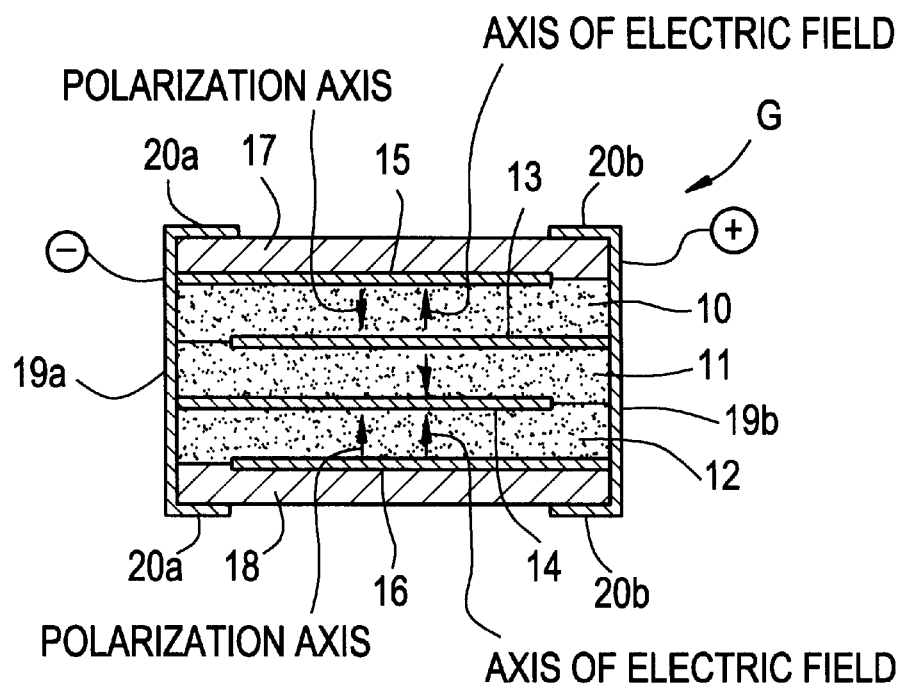
FIG. 19 is a sectional view, taken in the same way as in FIG. 3, of the piezoelectric resonator shown in FIG. 17.

FIGS. 17 to 19 show a seventh preferred embodiment of a piezoelectric resonator according to the present invention. In this piezoelectric resonator G, three substantially square piezoelectric layers 10, 11, and 12 are laminated with internal electrodes 13 and 14 sandwiched therebetween, surface electrodes 15 and 16 are disposed on both top and bottom main surfaces of the laminated outer piezoelectric layers 10 and 12, respectively, and substantially square insulation layers 17 and 18 are laminated to define outermost layers.

The middle piezoelectric layer 11, out of the above three piezoelectric layers, is not polarized, and the piezoelectric layers 10 and 12 on both sides of it are polarized in opposite directions relative to each other in the thickness direction as shown by solid line arrows in FIG. 19. Moreover, the polarization direction is not limited to the inward direction as shown in FIG. 19, but it may be outward. Four end surface electrodes 19a, 19b, 19c, and 19d are disposed on the end surfaces of the laminated piezoelectric layers 10, 11, and 12 and insulation layers 17 and 18, particularly in the middle portion of the four sides. The end surface electrodes 19a and 19c at opposing locations are connected to the internal electrode 14 and the top surface electrode 15, and the end surface electrodes 19b and 19d at opposing locations are connected to the internal electrode 13 and the bottom surface electrode 16. In order to make the end surface electrodes 19a and 19c insulated from the internal electrode 13 and the bottom surface electrode 16, recessed portions 13a and 13b, and 16a and 16b are disposed in the middle of the opposing two sides of the internal electrode 13 and the surface electrode 16, and in order to make the end surface electrodes 19b and 19d insulated from the internal electrode 14 and the top surface electrode 15, recessed portions 14a and 14b, and 15a and 15b are disposed in the middle of the opposing two sides of the internal electrode 14 and the surface electrode 15.

External electrodes 20a, 20b, 20c, and 20d extending on the surface of the insulation layers 17 and 18 are disposed at both upper and lower ends of the end surface electrodes 19a, 19b, 19c, and 19d. These external electrodes are positioned in the middle of the four sides of the insulation layers 17 and 18. The electrical characteristic of the above-described piezoelectric resonator G can be taken out from the external electrodes 20a and 20b, or 20c and 20d.

In the piezoelectric resonator G having the above-described construction, when a negative electric potential is applied to one external electrode 20a or 20c and a positive electric potential is applied to the other external electrode 20b or 20d, an electric field in the same direction is generated in the two piezoelectric layers 10 and 12 as shown by broken line arrows in FIG. 19. Because the polarization directions in the piezoelectric layers 10 and 12 are opposite to each other, the polarization direction and the direction of electric field becomes opposite to each other in one piezoelectric layer 10, and the polarization direction and the direction of electric field becomes the same in the other piezoelectric layer 12. The piezoelectric layer 12 where the polarization direction and the direction of electric field are the same contracts in its planar direction, and the piezoelectric layer 10 where the polarization direction and the direction of electric field are opposite to each other expands, and accordingly the entire piezoelectric resonator G bends so as to be protruded upward. When the electric field is reversed, the piezoelectric resonator G bends in the opposite direction. Therefore, when an AC electric field is applied between the external electrodes 20a and 20b, or 20c and 20d, bending vibration is generated at a fixed frequency in the piezoelectric resonator G.

In the case of the piezoelectric resonator G having the above-described construction, because the three piezoelectric layers 10, 11, and 12 are laminated, the capacitance between terminals is greatly increased, when compared with piezoelectric resonators utilizing spreading vibrations. That is, in the piezoelectric resonator G having a three-layer construction, assuming that the length of one side is Lb, the dielectric constant of the piezoelectric layers 10, 11, and 12 is $\epsilon$, and the thickness of the piezoelectric layers 10, 11, and 12 is t1, t2, and t3, respectively, the capacitance between terminals is defined by $$Cb=(\epsilon\cdot\epsilon_0\cdot Lb^2)(1/t_1+1/t_2+1/t_3)$$

where $\epsilon_0$ is the dielectric constant in vacuum. Here, the area of recessed portions of electrode is neglected. Now, in one-layer piezoelectric resonator utilizing spreading vibrations, in which the piezoelectric material is the same (the value of $\epsilon$ is the same), the dimension is the same (Lb=Ls), and the thickness is the same ($t_1+t_2+t_3=t$), the capacitance between terminals (Cs) is defined by $$Cs=(\epsilon\cdot\epsilon_0\cdot Lb^2)/t$$

Assuming that the thickness of each of the piezoelectric layers 10, 11, and 12 is equal ($t_1=t_2=t_3=t/3$), the capacitance between terminals (Cb) of a three-layer piezoelectric resonator G utilizing bending vibrations is defined by $$Cb = (\varepsilon\cdot\varepsilon_0\cdot Lb^2)/(9/t)$$
$$= 9Cs$$

Accordingly, in the piezoelectric resonator G utilizing bending vibrations, the capacitance between terminals that is nine times as large as that of the piezoelectric resonator, of the same material, substantially the same size, and substantially the same thickness, utilizing spreading vibrations can be obtained. Then, when this piezoelectric resonator G is used as a parallel resonator in a ladder-type filter, it is possible to increase the attenuation value to be determined by the capacitance ratio between the parallel resonator and the series resonator and to obtain broader filtering characteristics.

In the piezoelectric resonator utilizing bending vibrations, the value when a product of a square of the length of one side Lb and the resonance frequency fr is divided by the thickness t of the resonator is generally constant, and it is defined by $$A=(fr\times Lb^2)/t$$

Here, A is a constant (frequency-related constant) and A≅3400 kHz·mm. In order to obtain a resonator having a resonance frequency of fr=455 kHz, the length of one side becomes Ls=4.62 mm in the resonator of spreading vibrations and, on the other hand, the length of one side becomes Lb=1.22 mm when the thickness t of the resonator is 0.2 mm in the resonator of bending vibrations. Therefore, the size of the element can be greatly reduced.

Figure 20:
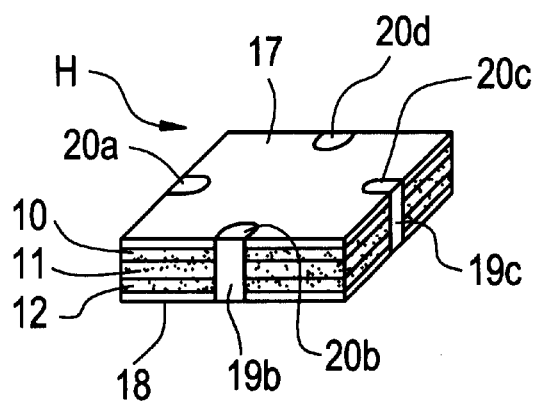
FIG. 20 is a perspective view of an eighth preferred embodiment of a piezoelectric resonator according to the present invention.
Figure 21:
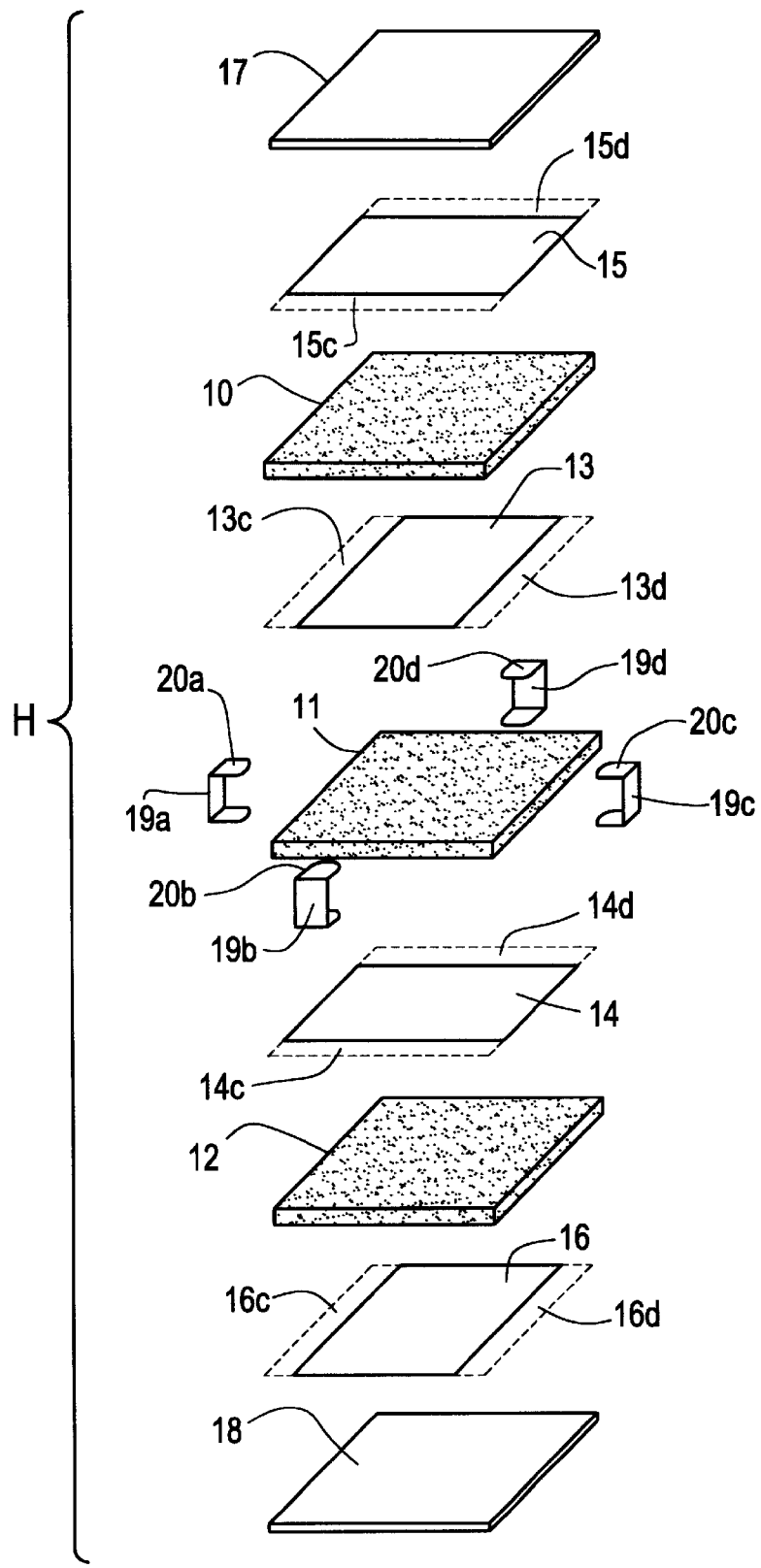
FIG. 21 is an exploded perspective view of the piezoelectric resonator shown in FIG. 20.

FIGS. 20 and 21 show an eighth preferred embodiment of a piezoelectric resonator according to the present invention. This piezoelectric resonator H has three piezoelectric layers similar to the piezoelectric resonator G, and the same reference numerals are used to indicate similar elements as in the piezoelectric resonator G and repetitious description is omitted. In the piezoelectric resonator H, recessed portions 13c, 13d, 14c, 14d, 15c, 15d, 16c, and 16d of the internal electrodes 13 and 14 and the surface electrodes 15 and 16 are arranged to be belt-shaped along the opposing edge portions of each electrode. Out of these, the recessed portions 13c, 13d, 16c, and 16d are formed in the edge portions which are different from those of the recessed portions 14c, 14d, 15c, and 15d. When the belt-shaped recessed portions are provided in this way, since the displacement can be neglected in the extension direction of the recessed portions, it becomes easier to position each of the electrodes 13 to 16 when the piezoelectric layers 10 to 12 are laminated.

Figure 22:
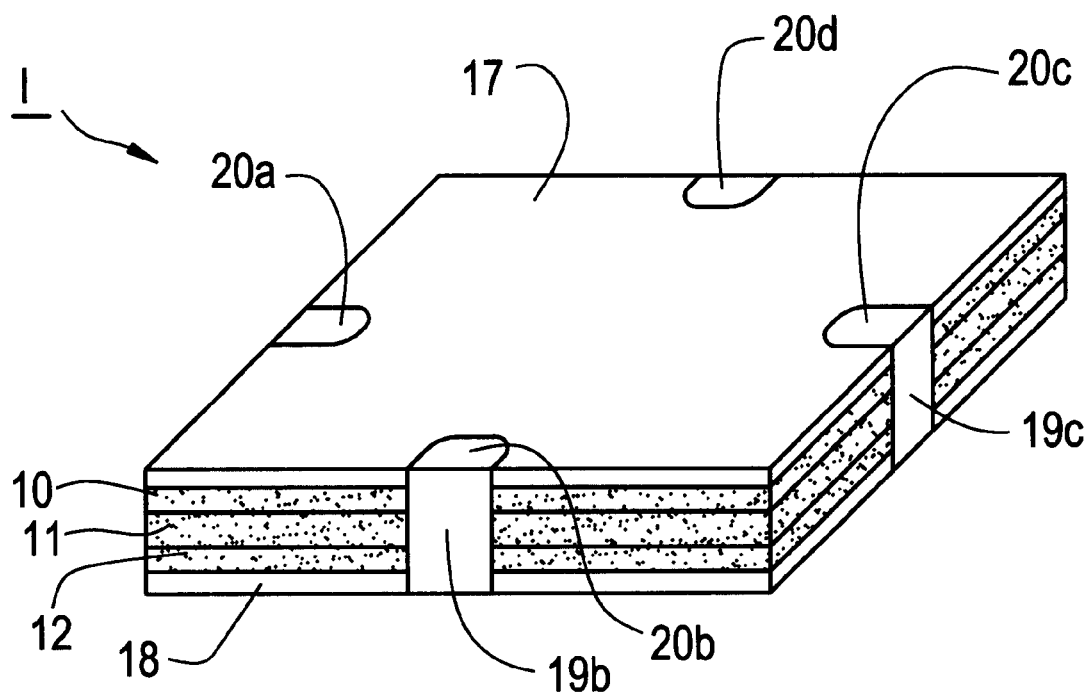
FIG. 22 is a perspective view of a ninth preferred embodiment of a piezoelectric resonator according to the present invention.
Figure 23:
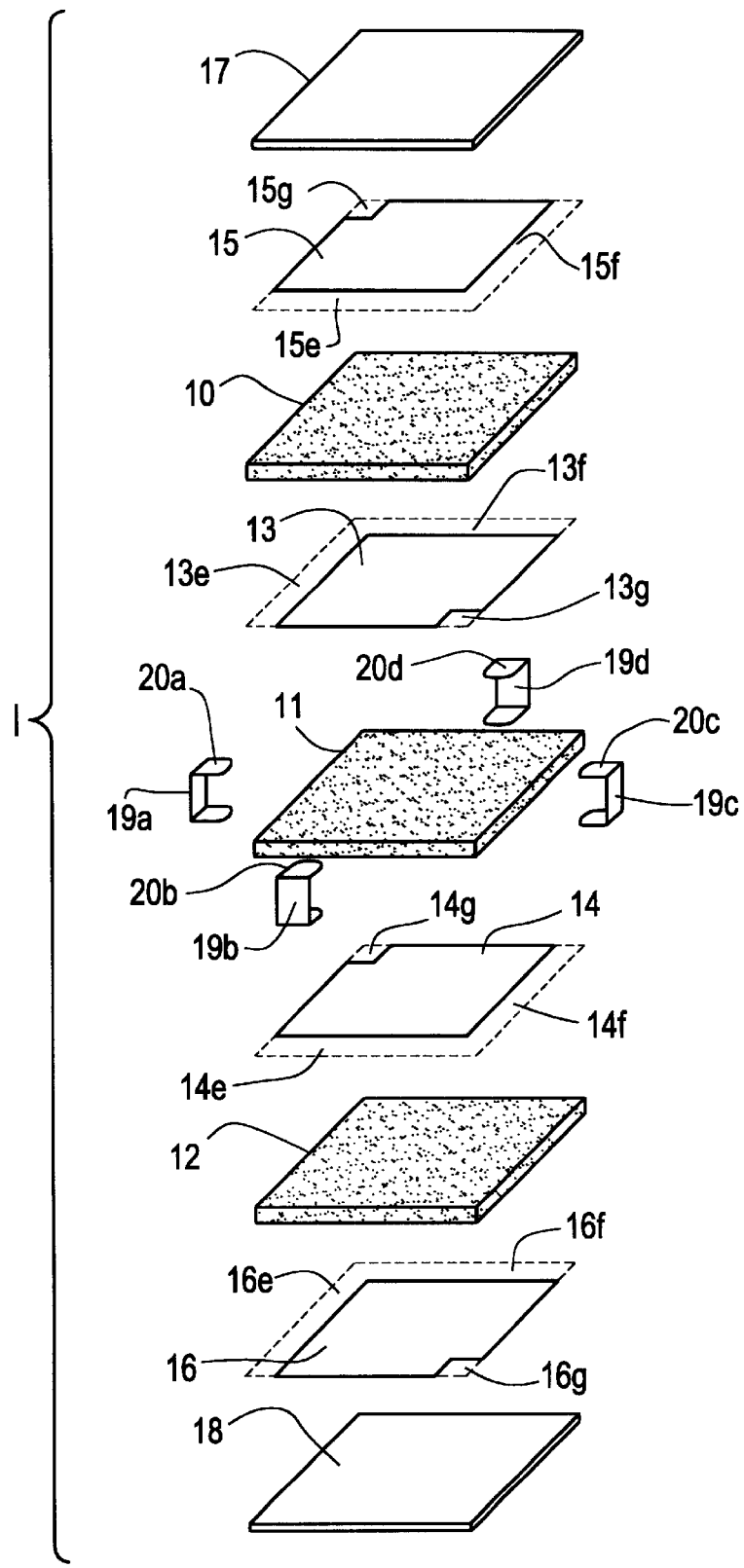
FIG. 23 is an exploded perspective view of the piezoelectric resonator shown in FIG. 22.

FIGS. 22 and 23 show a ninth preferred embodiment of a piezoelectric resonator according to the present invention. This piezoelectric resonator I has three piezoelectric layers similar to the piezoelectric resonator G, and the same reference numerals are used to indicate similar elements as in the piezoelectric resonator G and repetitious description is omitted. In the piezoelectric resonator I, recessed portions 13e, 13f, 14e, 14f, 15e, 15f, 16e, and 16f of the internal electrodes 13 and 14 and the surface electrodes 15 and 16 are preferably substantially L-shaped along two adjacent edges of each electrode. Out of these, the recessed portions 13e, 13f, 16e, and 16f are formed in the edge portions that are different from those of the recessed portions 14e, 14f, 15e, and 15f. Moreover, substantially square recessed portions 13g, 14g, 15g, and 16g having substantially the same width as the other recessed portions are formed at the corner portions of the sides which are different from the sides where each recessed portion is formed. In this case, the external electrodes 20a and 20d on the adjacent sides are connected to each other through the internal electrode 14, the surface electrode 15, and the end surface electrodes 19a and 19d, and the external electrodes 20b and 20c are connected to each other through the internal electrode 13, the surface electrode 16, and the end surface electrodes 19b and 19c. Therefore, when an AC electric field is applied between the external electrodes 20a and 20b, or 20d and 20c, bending vibration is generated in the piezoelectric resonator I.

Figure 24:
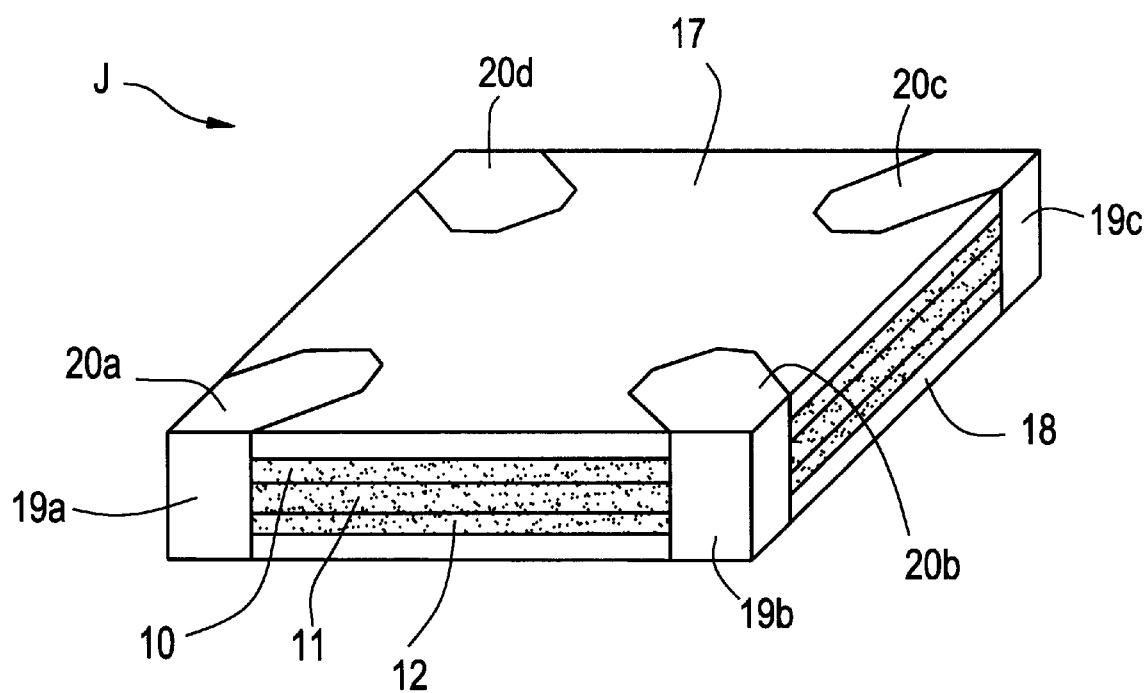
FIG. 24 is a perspective view of a tenth preferred embodiment of a piezoelectric resonator according to the present invention.
Figure 25:
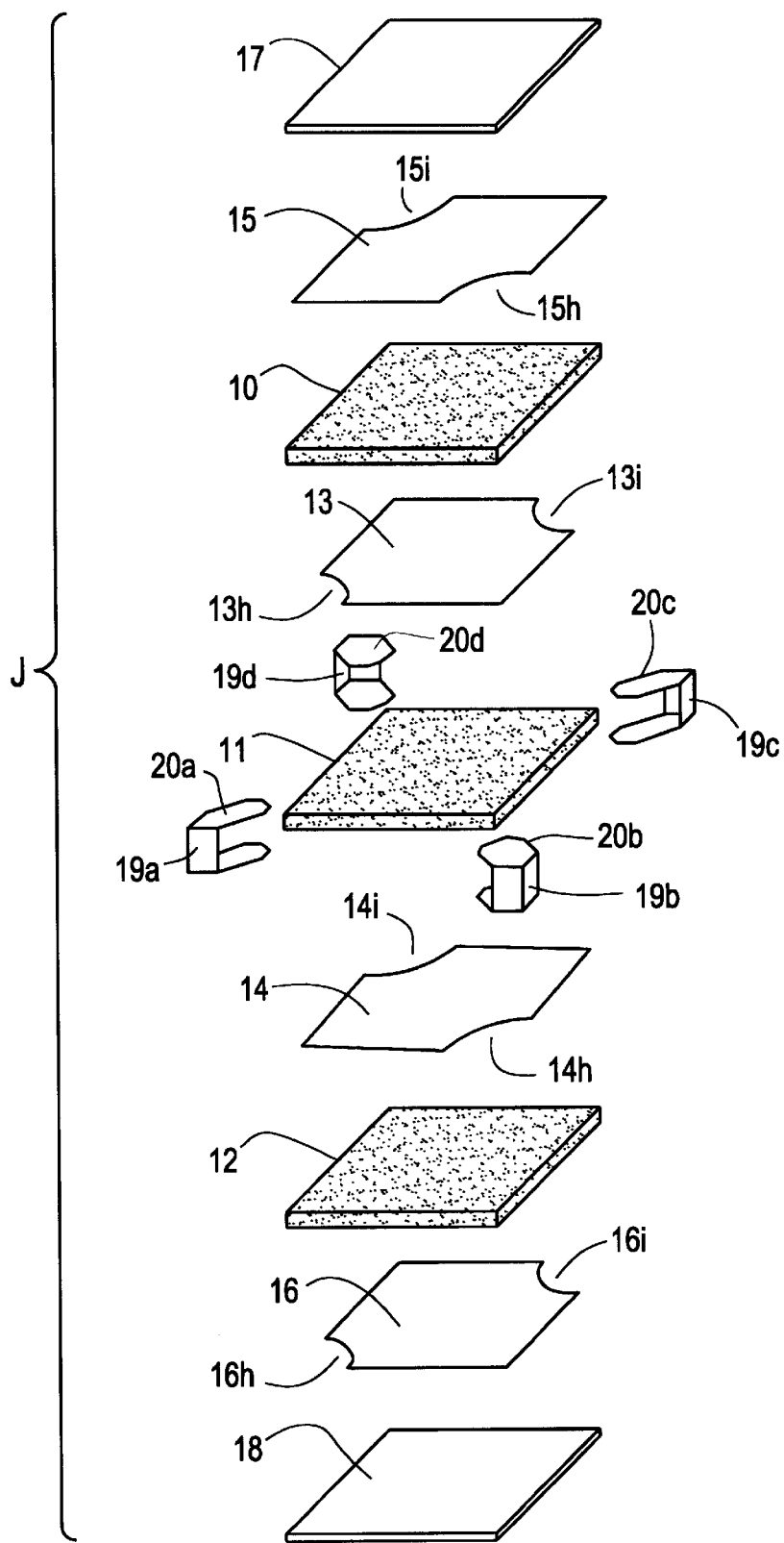
FIG. 25 is an exploded perspective view of the piezoelectric resonator shown in FIG. 24.

FIGS. 24 and 25 show a tenth preferred embodiment of a piezoelectric resonator according to the present invention. This piezoelectric resonator J has three piezoelectric layers similar to the piezoelectric resonator G, and the same reference numerals are used to indicate elements similar to those the piezoelectric resonator G and repetitious description is omitted. In the piezoelectric resonator J, recessed portions 13h, 13i, 16h, and 16i are formed in the opposing two corner portions of the internal electrode 13 and the bottom surface electrode 16, and recessed portions 14h, 14i, 15h, and 15i are formed in the opposing two corner portions, which are different from the corner portions, of the internal electrode 14 and the top surface electrode 15. In this case, corresponding to the recessed portions, the end surface electrodes 19a to 19d are also arranged so as to extend over the two end surfaces at the corner portions of the piezoelectric layers 10 to 12 and the insulation layers 17 and 18. Then, at the upper and lower end portions of the end surface electrodes 19a to 19d, the external electrodes 20a to 20d are diagonally extended to the nodal points shown in FIG. 5 from the four corner portions on the surface of the insulation layers 17 and 18. In this preferred embodiment, since the recessed portions are formed in the locations (corner portions), which do not affect bending vibrations, in the electrodes 13 to 16, the electrical characteristics are greatly improved (for example, Δf increases).

Figure 26:
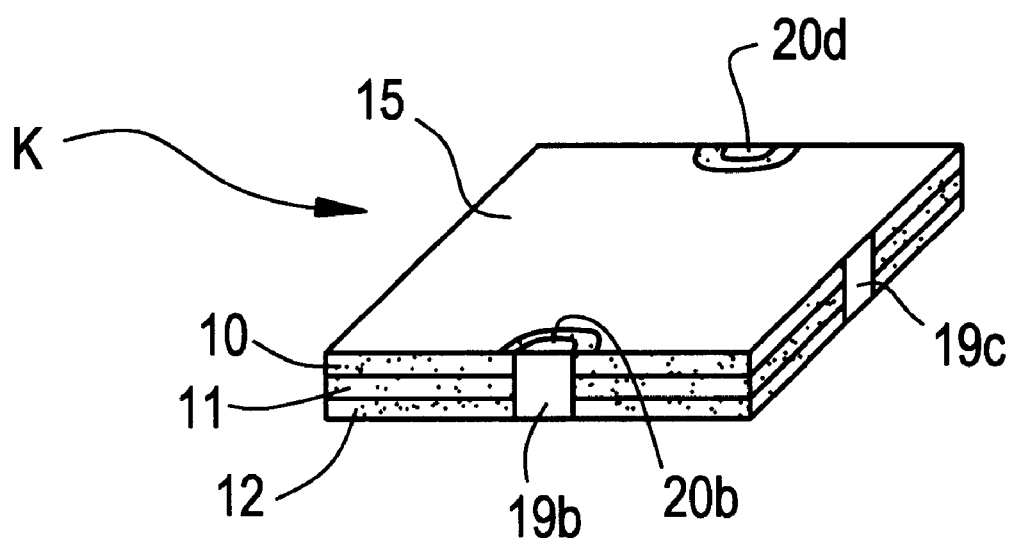
FIG. 26 is a perspective view of an eleventh preferred embodiment of a piezoelectric resonator according to the present invention.
Figure 27:
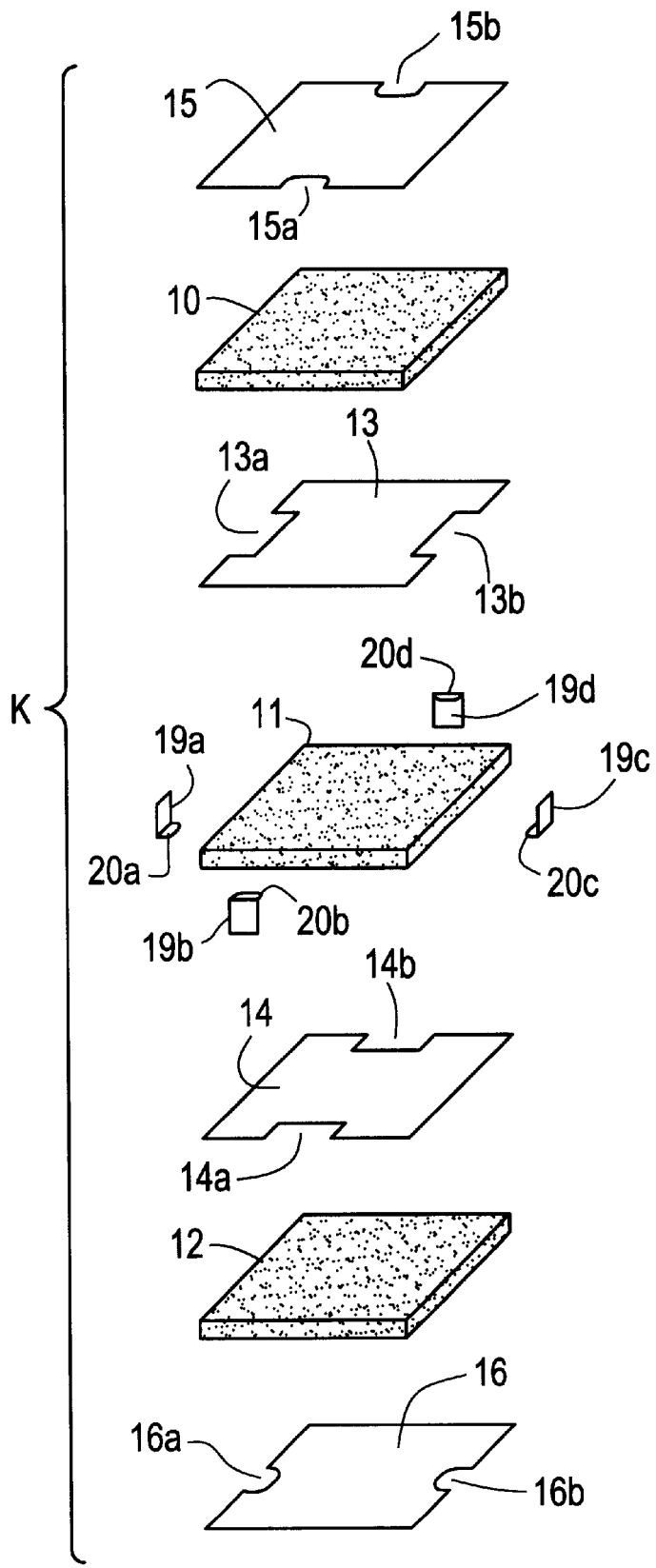
FIG. 27 is an exploded perspective view of the piezoelectric resonator shown in FIG. 26.
Figure 28:
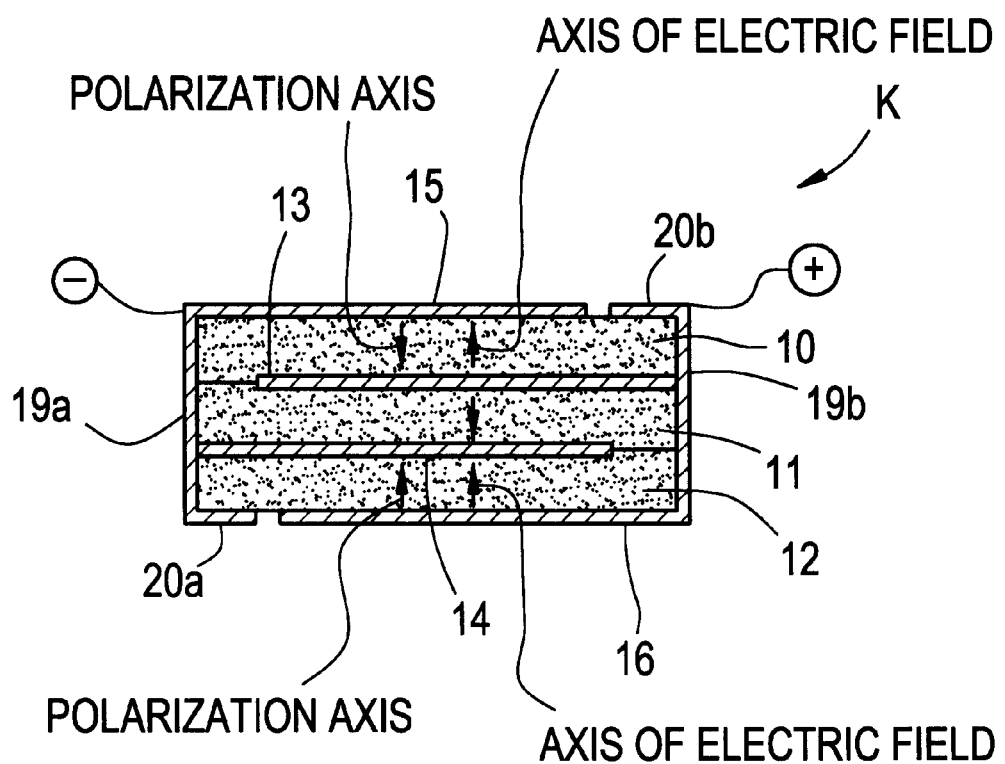
FIG. 28 is a sectional view, taken in the same way as in FIG. 3, of the piezoelectric resonator shown in FIG. 26.

FIGS. 26 to 28 show an eleventh preferred embodiment of a piezoelectric resonator according to the present invention. This piezoelectric resonator K has three piezoelectric layers similar to the piezoelectric resonator G, but do not contain the outermost insulation layers. In the piezoelectric resonator K, as shown by solid line arrows in FIG. 28, out of the three piezoelectric layers 10, 11, and 12, the middle piezoelectric layer 11 is not polarized and the piezoelectric layers 10 and 12 on both sides of it are polarized to be opposite to each other. Moreover, the polarization direction is not limited to the inward direction as in FIG. 28, but it may be in outward direction. In this preferred embodiment, the external electrodes 20a and 20c are disposed only at the lower end portion of the end surface electrodes 19a and 19c of the opposing two sides, out of the end surface electrodes 19a to 19d, and the external electrodes 20b and 20d are disposed only at the upper end portion of the end surface electrodes 19b and 19d of the other opposing two sides. Then, the external electrodes 20a and 20c are provided at the location of the recessed portions 16a and 16b of the bottom surface electrode 16, and the external electrodes 20b and 20d are provided at the location of the recessed portions 15a and 15b of the top surface electrode 15. In the case of the piezoelectric resonator K, the top and bottom surface electrodes 15 and 16 are also used as an external electrode. Therefore, the electrical characteristic of the piezoelectric resonator K is taken out between the external electrode 20b or 20d and the surface electrode 15 on the top surface, and between the external electrode 20a or 20c and the bottom surface electrode 16 on the bottom surface.

Figure 29:
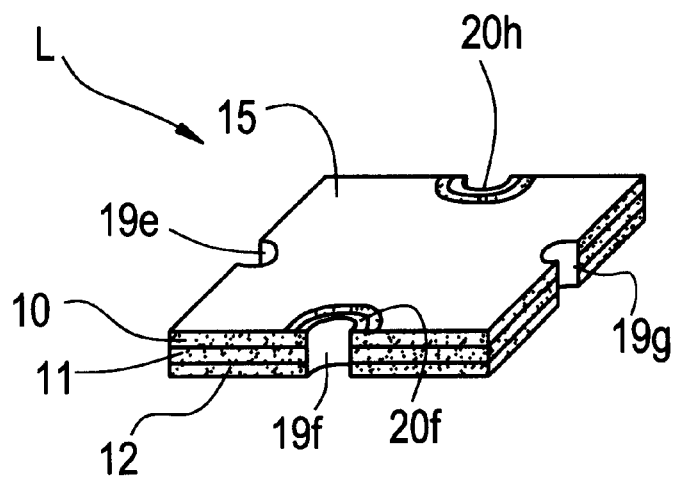
FIG. 29 is a perspective view of a twelfth preferred embodiment of a piezoelectric resonator according to the present invention.
Figure 30:
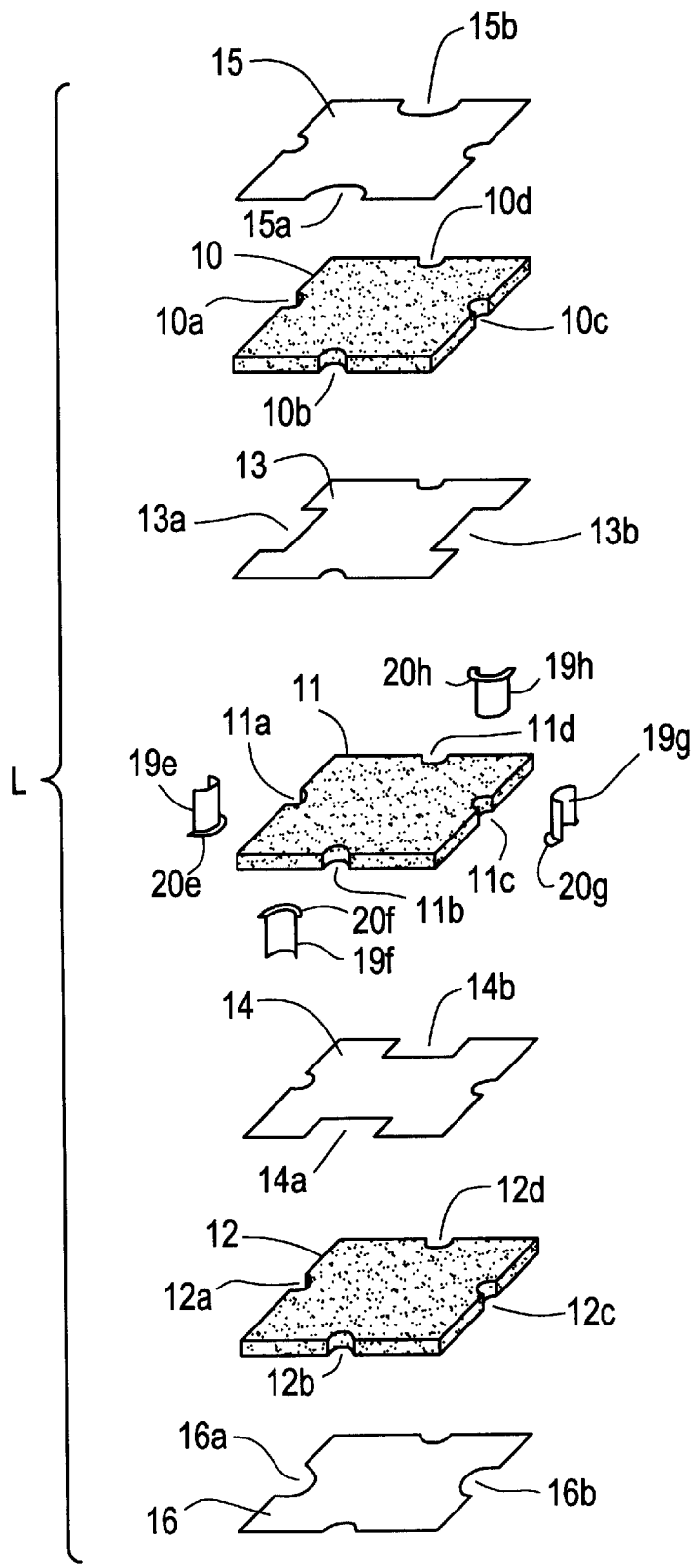
FIG. 30 is an exploded perspective view of the piezoelectric resonator shown in FIG. 29.

FIGS. 29 to 30 show a twelfth preferred embodiment of a piezoelectric resonator according to the present invention. This piezoelectric resonator L has three piezoelectric layers similar to the piezoelectric resonator G, but do not include the outermost insulation layers. In the piezoelectric resonator L, concave grooves 10a to 10d, 11a to 11d, and 12a to 12d which are continuous in the thickness direction are provided in the end surfaces of the laminated piezoelectric layers 10 to 12, and the end surface electrodes include electrodes 19e to 19h disposed on the inner surface of the concave grooves. The lower end portions of the opposing two inner surface electrodes 19e and 19g, out of the inner surface electrodes 19e to 19h, are connected to external electrodes 20e and 20g disposed in the recessed portions 16a and 16b of the bottom electrode 16, and the upper end portions of the other opposing two inner surface electrodes 19f and 19h are connected to external electrodes 20f and 20h disposed in the recessed portions 15a and 15b of the surface electrode 15. In this preferred embodiment, the concave grooves 10a to 10d, 11a to 11d, and 12a to 12d can be easily formed such that through-holes are formed in the piezoelectric layers 10 to 12 laminated in the state of a mother board and the through-holes are divided into two parts. Moreover since the inner surface electrodes 19e to 19h are able to be formed at the same time when the top and bottom electrodes 15 and 16 are formed, there is an advantage that the manufacturing process is greatly simplified.

Figure 31:
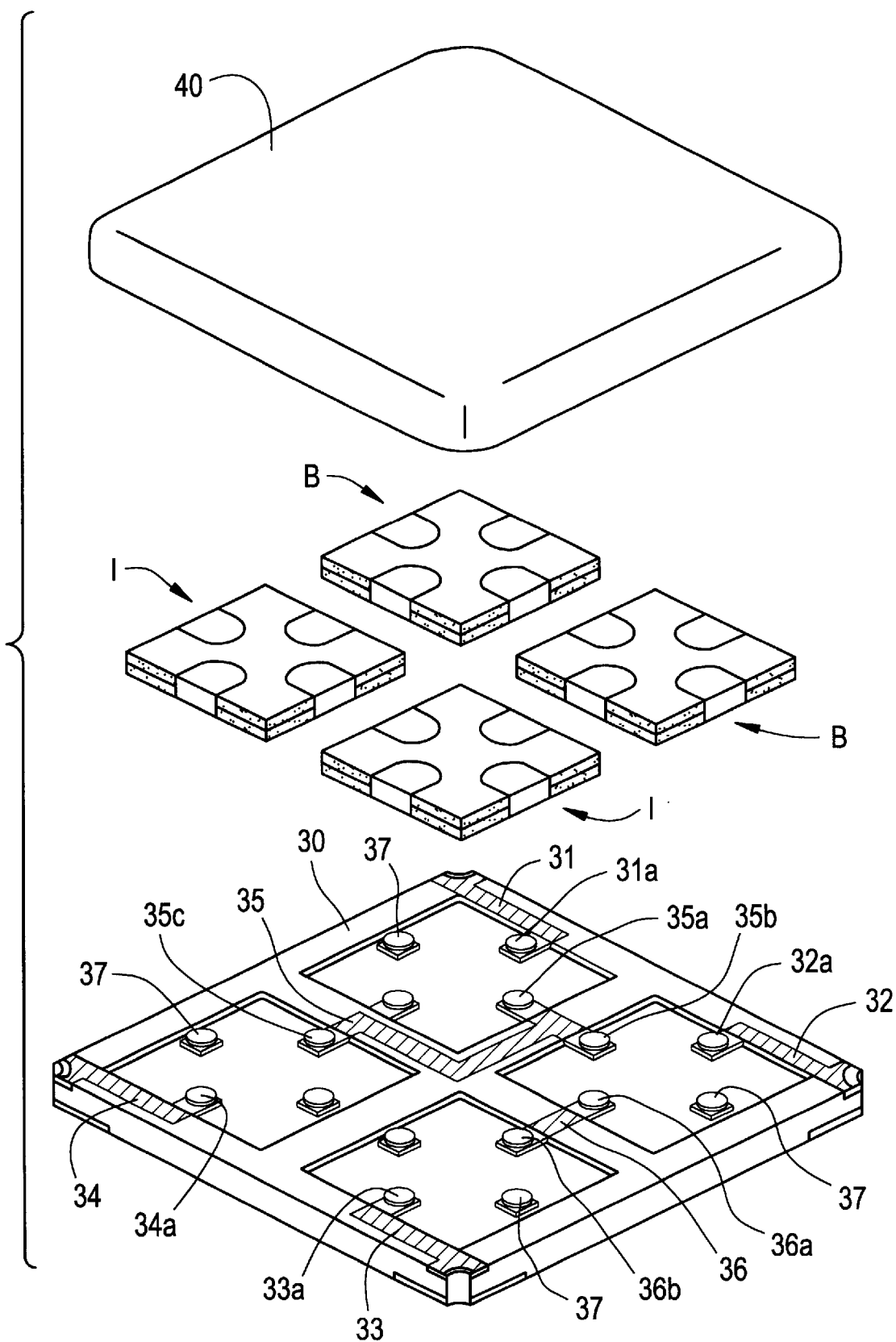
FIG. 31 is an exploded perspective view of a ladder-type filter using a piezoelectric resonator according to another preferred embodiment of the present invention.

FIG. 31 shows a ladder-type filter in which, out of the piezoelectric resonators according to the above-described preferred embodiments, the piezoelectric resonator B shown in FIG. 6, is used as a series resonator and the piezoelectric resonator I shown in FIG. 22 is used as a parallel resonator. The ladder-type filter preferably includes a board 30 having two series resonators B and two parallel resonators I mounted thereon and a cap 40 sealing the surroundings of the resonators B and I, and is constructed as a surface mounting component.

The board 30 is preferably a substantially square insulating thin plate made of alumina ceramics, glass-ceramic, glass-epoxy resin, heat-resistant resin, or other suitable material, and an input pattern electrode 31, an output pattern electrode 32, grounding pattern electrodes 33 and 34, and connection pattern electrodes 35 and 36 are disposed on the upper surface of the board 30 by a known method such as sputtering, evaporation, printing, or other suitable method. The external connection portion of each of the pattern electrodes 31 to 34 is extended on the side of the bottom surface through the through-holes formed in the four corner portions of the board 30.

The external electrodes 9a and 9b, or 9c and 9d of one series resonator B are connected and fixed to a land portion 31a of the input electrode 31 and a land portion 35a of the connection electrode 35 by using a conductive adhesive or by soldering, and the external electrodes 9a and 9b, or 9c and 9d of the other series resonator B are connected and fixed to a land portion 32a of the output electrode 32 and a land portion 35b of the connection electrode 35 by using a conductive adhesive or by soldering. In this way, the series resonators B are connected between the input electrode 31 and the connection electrode 35 and between the output electrode 32 and the connection electrode 35 of the board 30. Moreover, one external electrode of the other series resonator B is also connected to a land portion 36a of the connection electrode 36 that is opposed to the land portion 32a of the output electrode 32.

Figure 32:
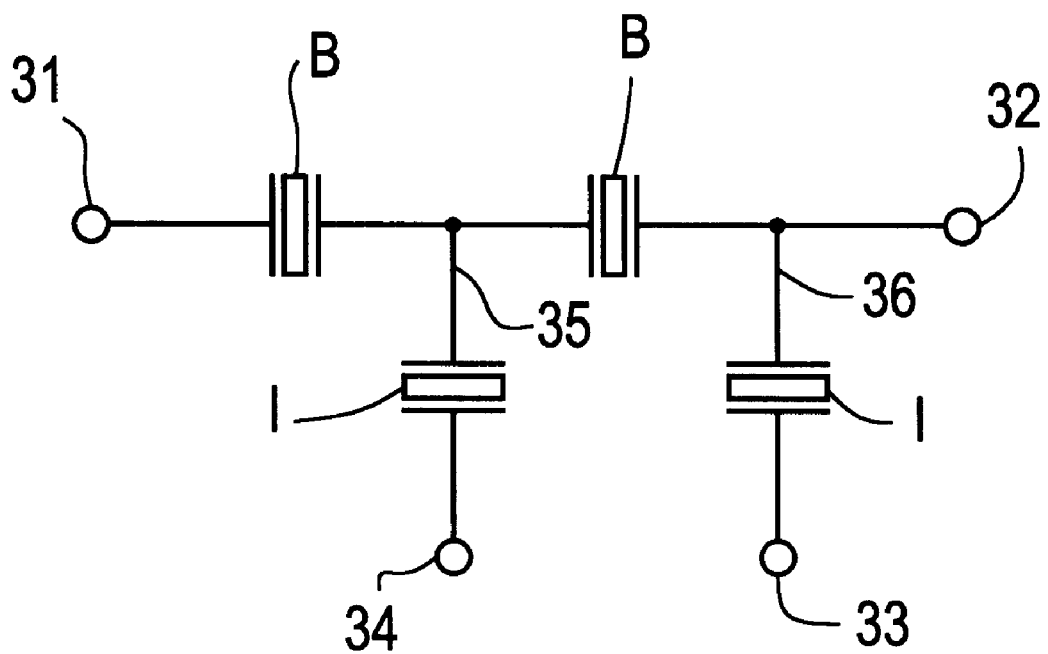
FIG. 32 is a circuit diagram of the ladder-type filter shown in FIG. 31.

The external electrode 20a and 20b, or 20d and 20c of one parallel resonator I are connected and fixed to a land portion 35c of the connection electrode 35 and a land portion 34a of the grounding electrode 34 by using a conductive adhesive or by soldering, and the external electrode 20a and 20b, or 20d and 20c are connected and fixed to a land portion 36b of the connection electrode 36 and a land portion 33a of the grounding electrode 33 by using a conductive adhesive or by soldering. Moreover, dummy electrodes 37 are intended to support the resonators B and I in a stable manner. As described above, by using the piezoelectric resonator B, in which the input-output electrodes are provided on the adjacent sides, as a series resonator and the piezoelectric resonator I, in which the input-output electrodes are provided on the opposing sides, as a parallel resonator, a ladder-type filter having a circuit shown in FIG. 32 can be constructed.

As described above, since electrical characteristics can be taken out from either of the top and bottom main surfaces in the series resonator B and the parallel resonator I, the connection to the board is simple. Moreover, since the external electrodes 9a and 9b, and 9c and 9d of the series resonator B, and the external electrodes 20a and 20b, and 20c and 20d of the parallel resonator I are provided in the vicinity of the nodal points, when the series resonator B and parallel resonator I are mounted, their bending vibrations are not obstructed. Furthermore, since the series resonator B is a piezoelectric resonator having two piezoelectric layers and the parallel resonator I is a piezoelectric resonator having three piezoelectric layers, the capacitance between terminals of the parallel resonator I can be made larger than that of the series resonator B. Therefore, the capacitance ratio between a parallel resonator and a series resonator can be increased, and, as a result, a ladder-type filter having a large attenuation value can be obtained.

The opening portion of the cap 40 covering the resonators B and I are fixed on the board 30 preferably with an insulating adhesive (not illustrated), and the surrounding areas of the resonators B and I are sealed. The cap 40 in this preferred embodiment is preferably made of a stamped metal plate, but it may be a resin cap or a ceramic cap. When a metal cap is used, the electrical connection between the metal cap 40 and the pattern electrodes 31 and 32 can be prevented by forming an insulating film, which covers the surface of the external connection portion of the output pattern electrodes 31 and 32, on the surface of the board 30.

The piezoelectric resonator according to the present invention is not limited to the above-described preferred embodiments. For example, in the piezoelectric resonator having two piezoelectric layers, the case, in which the piezoelectric layers are polarized in opposite directions relative to each other, was shown, but, even if the two piezoelectric layers are polarized in the same direction and the electric field is made opposite to each other, bending vibrations can be also generated. Furthermore, in the piezoelectric resonator having three piezoelectric layers, the middle piezoelectric layer was not polarized, but it may be polarized. The piezoelectric resonator according to the present invention is not limited to piezoelectric resonators having two or three piezoelectric layers, and four or more piezoelectric layers may be provided. The ladder-type filter according to the present invention is not limited to the one in which resonators utilizing bending vibrations are mounted in a plane on the board as shown in FIG. 31, but it may be one in which a plurality of resonators, substantially parallel to each other, are housed in a box-shape case and terminals led outside the case are connected to the resonators.

As is made clear in the above description, according to the first preferred embodiment of the present invention, since the electrode layers are connected to each other by the first and second end surface electrodes such that, in at least one piezoelectric layer, an electric field is generated in the same direction as the polarization direction in the piezoelectric layer and that, in at least one of the other piezoelectric layers, an electric field is generated in opposite direction relative to the polarization direction in the piezoelectric layer, bending vibration can be generated as an entire piezoelectric resonator. Since the piezoelectric resonator utilizing bending vibrations can be made smaller than the piezoelectric resonator utilizing spreading vibrations as long as the resonance frequency is the same, a piezoelectric resonator having a much smaller size can be realized. Furthermore, since the electrode layers are connected to each other by the first and second end surface electrodes, the insulation layers are provided on the surface of the outermost electrode layers, and the first and second external electrodes connected to the first and second end surface electrodes, respectively, are provided on the outer surface of the insulation layers, accordingly the electric characteristics can be taken out from either of the main surfaces of the piezoelectric resonator. That is, the piezoelectric resonator as a surface mounting type component can be easily constructed. When the electrode layers are connected to each other by using the end surface electrodes, it is required to connect electrode layers alternately to an end surface electrode and make the electrode layers alternately insulated from the end surface electrode, but by forming recessed portions in the edge portions of the electrode layers, the electrode layers and the end surface electrodes can be easily insulated from each other and the manufacturing process can be simplified.

According to another preferred embodiment of the present invention, in addition to the effect of the preferred embodiment described above, the outermost electrode layer is shared as one external electrode, and since the other external electrode is disposed in the recessed portion of the outermost electrode layer, electrical characteristics can be taken out from either of the main surfaces without providing any insulation layer.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric resonator utilizing bending vibrations, comprising:

three or more electrode layers and two or more piezoelectric layers being alternately laminated on each other;

first and second end surface electrodes provided on end surfaces of the laminated piezoelectric layers;

recessed portions arranged to insulate at least one of the three or more electrode layers, which is not connected to the first or second end surface electrodes, from the first or second end surface electrodes, the recessed portions provided in a peripheral portion of the one of the at least three electrode layers that is not connected to the first or second end surface electrodes;

insulation layers provided on the surface of the outermost of the three or more electrode layers; and first and second external electrodes, which are connected to the first and second end surface electrodes respectively, provided on the outer surface of the insulation layers;

wherein at least two of the piezoelectric layers are polarized in the thickness direction; and wherein the first and second end surface electrodes and the electrode layers are connected such that, in at least a first of the piezoelectric layers, an electric field is generated in the same direction as the polarization direction in the first of the piezoelectric layers and that, in at least a second of the piezoelectric layers, an electric field is generated to be opposite to the polarization direction in the second of the piezoelectric layers.

2. A piezoelectric resonator as claimed in claim 1, wherein the piezoelectric layers and the insulation layers are substantially square-shaped.

3. A piezoelectric resonator as claimed in claim 1, wherein the first and second end surface electrodes are disposed substantially in the middle of the four sides of the piezoelectric layers, and the first and second external electrodes are disposed substantially in the middle of the insulation layers.

4. A piezoelectric resonator as claimed in claim 1, wherein the piezoelectric layers are substantially square-shaped, and the first and second end surface electrodes are disposed at the corner portions of the piezoelectric layers.

5. A piezoelectric resonator as claimed in claim 1, wherein the recessed portions of the electrode layers are belt-shaped along a periphery of the electrode layers.

6. A piezoelectric resonator as claimed in claim 1, wherein the piezoelectric layers are substantially square-shaped, and the first and second end surface electrodes are provided on the opposing sides of the piezoelectric layers.

7. A piezoelectric resonator as claimed in claim 1, wherein the insulation layers are made of one of a material having no piezoelectric characteristics, and a material having piezoelectric characteristics and not being polarized.

8. A piezoelectric resonator as claimed in claim 1, wherein the external electrodes are disposed at nodal points on the sides of the piezoelectric resonator.

9. A piezoelectric resonator as claimed in claim 1, wherein two of the two or more piezoelectric layers are polarized in opposite directions relative to each other in one of an inward direction and an outward direction.

10. A ladder-type filter comprising a series resonator and a parallel resonator, each of the series resonator and the parallel resonator including a piezoelectric resonator according to claim 1.

11. A ladder-type filter as claimed in claim 10, wherein the parallel resonator has more piezoelectric layers than the series resonator.

12. A ladder-type filter as claimed in claim 10, wherein the series resonator and the parallel resonator are mounted in a common plane on a board on which input electrodes, output electrodes, grounding electrodes, and connection electrodes are provided, and wherein a cap is fixed on the board so as to cover the series resonator and the parallel resonator.

13. A piezoelectric resonator utilizing bending vibrations, comprising:

three or more electrode layers and two or more piezoelectric layers being alternately laminated on each other;

first and second end surface electrodes provided on the end surfaces of the laminated piezoelectric layers;

a first recessed portion provided in one of the outermost electrode layers such that the one of the outermost electrode layers is insulated from the first end surface electrode and a first external electrode connected to the first end surface electrode; and a second recessed portion provided in the other of the outermost electrode layers such that the other one of the outermost electrode layers is insulated from the second end surface electrode and a second external electrode connected to the second end surface electrode;

wherein at least two of the piezoelectric layers are polarized in the thickness direction; and wherein the first and second end surface electrodes and the electrode layers are connected such that, in at least a first of the piezoelectric layers, an electric field is generated in the same direction as the polarization direction in the first of the piezoelectric layers and such that, in at least a second of the piezoelectric layers, an electric field is generated to be opposite to the polarization direction in the second of the piezoelectric layers.

14. A piezoelectric resonator as claimed in claim 13, wherein the piezoelectric layers are substantially square-shaped, and the first and second end surface electrodes are disposed at the corner portions of the piezoelectric layers.

15. A piezoelectric resonator as claimed in claim 13, wherein the recessed portions of the electrode layers are belt-shaped along a periphery of the electrode layers.

16. A piezoelectric resonator as claimed in claim 13, wherein the piezoelectric layers are substantially square-shaped, and the first and second end surface electrodes are provided on the opposing sides of the piezoelectric layers.

17. A piezoelectric resonator as claimed in claim 13, wherein concave grooves, which are continuous in the thickness direction, are provided in the end surfaces of the laminated piezoelectric layers, and the end surface electrodes includes the electrodes disposed on the inner surface of the concave grooves.

18. A piezoelectric resonator as claimed in claim 13, wherein the external electrodes are disposed at nodal points on the sides of the piezoelectric resonator.

19. A piezoelectric resonator as claimed in claim 13, wherein two of the two or more piezoelectric layers are polarized in opposite directions relative to each other in one of an inward direction and an outward direction.

20. A piezoelectric resonator as claimed in claim 13, further comprising insulation layers provided on the surface of the outermost of the three or more electrode layers, wherein the piezoelectric layers and the insulation layers are substantially square-shaped.

21. A piezoelectric resonator as claimed in claim 20, wherein the first and second end surface electrodes are disposed substantially in the middle of the four sides of the piezoelectric layers, and the first and second external electrodes are disposed substantially in the middle of the insulation layers.

22. A piezoelectric resonator as claimed in claim 20, wherein the insulation layers are made of one of a material having no piezoelectric characteristics, and a material having piezoelectric characteristics and not being polarized.

23. A ladder-type filter comprising a series resonator and a parallel resonator, each of the series resonator and the parallel resonator including a piezoelectric resonator according to claim 13.

24. A ladder-type filter as claimed in claim 23, wherein the parallel resonator has more piezoelectric layers than the series resonator.

25. A ladder-type filter as claimed in claim 23, wherein the series resonator and the parallel resonator are mounted in a common plane on a board on which input electrodes, output electrodes, grounding electrodes, and connection electrodes are provided, and wherein a cap is fixed on the board so as to cover the series resonator and the parallel resonator.

\* \* \* \* \*